US008944551B2

United States Patent
Otsuka et al.

(10) Patent No.: US 8,944,551 B2
(45) Date of Patent: Feb. 3, 2015

(54) LIQUID DISCHARGE APPARATUS

(71) Applicant: Seiko Epson Corporation, Tokyo (JP)

(72) Inventors: Shuji Otsuka, Nagano (JP); Tadashi Kiyuna, Tokyo (JP); Toshifumi Asanuma, Tokyo (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/205,953

(22) Filed: Mar. 12, 2014

(65) Prior Publication Data

US 2014/0285553 A1 Sep. 25, 2014

(30) Foreign Application Priority Data

Mar. 22, 2013 (JP) .................................. 2013-059504

(51) Int. Cl.
*B41J 29/38* (2006.01)
*B41J 2/045* (2006.01)

(52) U.S. Cl.
CPC ............ *B41J 2/0455* (2013.01); *B41J 2/04588* (2013.01)
USPC .................................. 347/11; 347/9; 347/68

(58) Field of Classification Search
USPC ................ 347/5, 9, 11–13, 40, 42, 68, 70, 71
See application file for complete search history.

(56) References Cited

U.S. PATENT DOCUMENTS 7,537,299 B2   5/2009  Tamura
8,020,974 B2 * 9/2011  Hara et al. ...................... 347/70

FOREIGN PATENT DOCUMENTS

JP         2013-006424 A      1/2013

* cited by examiner

*Primary Examiner* — Juanita D Jackson
(74) *Attorney, Agent, or Firm* — Global IP Counselors, LLP

(57) ABSTRACT

A liquid discharge apparatus includes first and second discharge sections, first and second connection paths and a voltage generation section. Each of the first and second discharge sections has a nozzle configured and arranged to discharge a liquid, a pressure chamber in communication with the nozzle, and a piezoelectric element. The first connection path selection section is arranged so as to correspond to the first discharge section and configured to selectively supply a plurality of voltages to the first discharge section. The second connection path selection section is arranged so as to correspond to the second discharge section and configured to selectively supply a plurality of voltages to the second discharge section. The voltage generation section is configured to generate and supply the voltages shared by the first connection path selection section and the second connection path selection section.

9 Claims, 14 Drawing Sheets

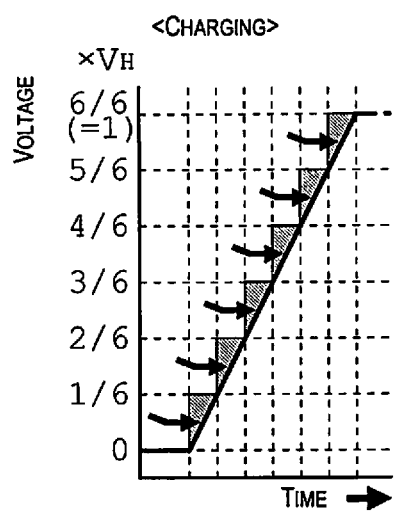
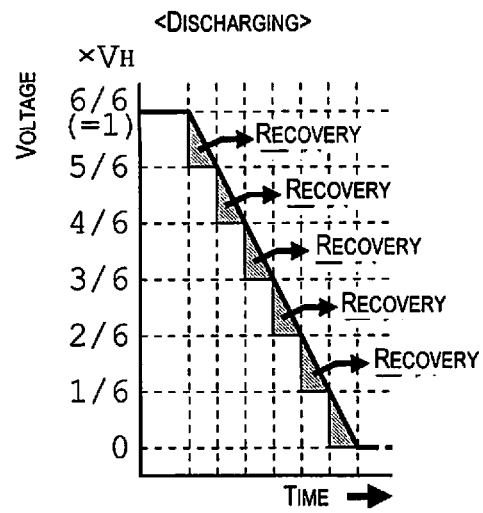
Fig. 12A
Fig. 12B

LIQUID DISCHARGE APPARATUS

CROSS-REFERENCE TO RELATED APPLICATIONS

This application claims priority to Japanese Patent Application No. 2013-059504 filed on Mar. 22, 2013. The entire disclosure of Japanese Patent Application No. 2013-059504 is hereby incorporated herein by reference.

BACKGROUND

1. Technical Field

The present invention relates to a feature for discharging droplets.

2. Related Art

A print apparatus for discharging droplets of ink from nozzles of a print head by driving piezoelectric elements corresponding to each of the nozzles has been conventionally proposed. For example, Japanese Laid-open Patent Publication No. 2013-006424 discloses a print apparatus in which a plurality of switches (transmission gates) corresponding at a one-to-one ratio to a plurality of piezoelectric elements are arranged, and shared control signals are selected for every piezoelectric element by each of the switches and supplied to each of the piezoelectric elements.

SUMMARY

With a configuration in which shared control signals are selectively supplied to each of the piezoelectric elements, as in Japanese Laid-open Patent Publication No. 2013-006424, control signals of a very large electrical current must be supplied to the print head so that control signals of the proper waveform are supplied to each of the piezoelectric elements even in a case where a large number (for example, all) of the piezoelectric elements are to be driven at the same time. As such, it is necessary to fully ensure the withstand voltage performance and withstand current performance of the circuitry used in the supply of the control signals, and a problem arises in that it is difficult to reduce the scale of circuitry. In view of the above circumstances, an objective of the present invention is to reduce the withstand voltage performance and withstand current performance that are required.

A liquid discharge apparatus according to one aspect includes first and second discharge sections, first and second connection paths and a voltage generation section. Each of the first and second discharge sections has a nozzle configured and arranged to discharge a liquid, a pressure chamber in communication with the nozzle, and a piezoelectric element provided for the pressure chamber and configured and arranged to cause the liquid to be discharged from the nozzle by charging and discharging in accordance with a drive signal. The first connection path selection section is configured to selectively supply a plurality of voltages to the first discharge section. The first connection path selection section is arranged so as to correspond to the first discharge section. The second connection path selection section is configured to selectively supply a plurality of voltages to the second discharge section. The second connection path selection section is arranged so as to correspond to the second discharge section. The voltage generation section is configured to generate and supply the voltages shared by the first connection path selection section and the second connection path selection section. With the above configuration, the first connection path selection section corresponding to the first discharge section and the second connection path selection section corresponding to the second discharge section are arranged, and the plurality of voltages supplied from the voltage generation section are selectively supplied by the first connection path selection section to the first discharge section and selectively supplied by the second connection path selection section to the second discharge section. As such, an advantage arises in that the withstand voltage performance and withstand current performance required for the circuitry are reduced (and consequently the circuitry scale is reduced) in comparison to a configuration in which a control signal shared across a plurality of nozzles is individually selected by switches of every nozzle and supplied to a piezoelectric element.

The liquid discharge apparatus as in the above aspect may further include a control signal supply section configured to supply a control signal, a first switch configured and arranged to control supply/shutting off of the control signal to the first connection path selection section, and a second switch configured and arranged to control supply/shutting off of the control signal to the second connection path selection section. The first connection path selection section may be configured to selectively supply the voltages to the first discharge section in accordance with the control signal supplied from the first switch, and the second connection path selection section may be configured to selectively supply the voltages to the second discharge section in accordance with the control signal supplied from the second switch. With the above configuration, a plurality of voltages are selectively supplied to the piezoelectric elements in accordance with the control signals supplied to each of the connection path selection sections, by the control of the supply/shutting off of the shared control signal by each of the plurality of switches. As such, an advantage arises in that the apparatus configuration and control processes are simplified in comparison to a configuration in which the control signal is individually generated for every discharge section.

The liquid discharge apparatus as in the above aspect may further include a first control signal supply section configured to generate a control signal and selectively supply the control signal to the first connection path selection section, the first control signal supply section being arranged so as to correspond to the first connection path selection section, and a second control signal supply section configured to generate a control signal and selectively supply the control signal to the second connection path selection section, the second control signal supply section being arranged so as to correspond to the second connection path selection section. The first connection path selection section may be configured to selectively supply the voltages to the first discharge section in accordance with the control signal supplied from the first control signal supply section, and the second connection path selection section may be configured to selectively supply the voltages to the second discharge section in accordance with the control signal supplied from the second control signal supply section. With the above aspect, the control signal supply sections installed for every discharge section generate the control signals individually, and therefore it is possible to adjust the control signal for every discharge section, so that, for example, the differences in properties of each of the piezoelectric elements are compensated for.

The liquid discharge apparatus as in the above aspect may further include a first signal path through which a first voltage is applied by the voltage generation section, and a second signal path through which a second voltage higher than the first voltage is applied by the voltage generation section. The first connection path selection section may electrically connect the first discharge section and the voltage generation section by the first signal path or the second signal path in accordance with a voltage of a control signal and a holding voltage of the piezoelectric element, and the second connection path selection section may electrically connect the second discharge section and the voltage generation section by the first signal path or the second signal path in accordance with the voltage of the control signal and the holding voltage of the piezoelectric element. With the above aspect, charging or discharging of the piezoelectric element is executed by electrically connecting the piezoelectric element to the first signal path or the second signal path; also, this electrical connection is defined taking not only the voltage of the control signal into account but also the holding voltage of the piezoelectric element. Therefore, the piezoelectric element can be finely controlled. Also, the charging and discharging of the piezoelectric element proceeds in a stepwise manner, and therefore the energy efficiency can be increased compared to a conventional configuration where charging and discharging are performed all at once between power source voltages. The occurrence of electromagnetic interference (EMI) can also be minimized, because a large current is not switched, as in class D amplification.

A liquid discharge apparatus as in a preferred aspect of the present invention is equipped with a detection section for detecting whether or not the holding voltage of the piezoelectric element is less than the first voltage, or whether or not the holding voltage of the piezoelectric is between the first voltage and less than the second voltage. With the above aspect, whether or not the holding voltage of the piezoelectric element is less than the first voltage, or whether or not the holding voltage of the piezoelectric is between the first voltage and less than the second voltage, is detected. As the detection section, a portion for detecting whether or not the holding voltage of the piezoelectric element is less than the first voltage and a portion for detecting whether or not the holding voltage of the piezoelectric element is between the first voltage and less than second voltage may be individually divided or may be integrated together.

In another aspect, each of a plurality of connection path selection sections comprising the first connection path selection section and the second connection path selection section control a charge with which the piezoelectric element is charged via the first signal path in conformity with the voltage of the control signal at less than the first voltage, and control a charge discharged from the piezoelectric element via the first signal path or a charge with which the piezoelectric element is charged via the second signal path in accordance with the voltage of the control signal at between the first voltage and less than the second voltage. According to the above aspect, the charge by which the piezoelectric element is charged/discharged is controlled in conformity with the voltage of the control signal.

In another aspect, each of the plurality of connection path selection sections comprises a first transistor, a second transistor, and a third transistor, wherein at less than the first voltage, the first transistor controls a charge with which the piezoelectric element is charged via the first signal path in accordance with a voltage obtained when the voltage of the control signal is shifted by a predetermined value to a low side, and at between the first voltage and less than the second voltage, the second transistor controls a charge discharged from the piezoelectric element via the first signal path in accordance with a voltage obtained when the voltage of the control signal is shifted by the predetermined value to a high side, and the third transistor controls a charge with which the piezoelectric element is charged via the second signal path in accordance with a voltage obtained when the voltage of the control signal is shifted by the predetermined value to the low side. In the above aspect, preferably, the predetermined value should be zero when the first transistor, the second transistor, and the third transistor are ideal, but, for example, is a voltage equivalent to a bypass voltage with a bipolar transistor or, for example, a voltage equivalent to a threshold value voltage with a metal-oxide semiconductor field effect transistor (MOSFET).

In another aspect, the first transistor is off at not less than the first voltage, and the second transistor and the third transistor are off at not between the first voltage and less than the second voltage. The above aspect causes the first transistor to be off, and therefore causes the piezoelectric element to be electrically disconnected from the first signal path, when the holding voltage of the piezoelectric element is not less than the first voltage; and also causes the second transistor and the third transistor to be off, and therefore causes the piezoelectric element to be electrically disconnected from the second signal path, when the holding voltage of the piezoelectric element is not between the first voltage and less than the second voltage.

In another aspect, each of the plurality of connection path selection sections controls charge with which the piezoelectric element is charged or the charge discharged from the piezoelectric element, at a voltage obtained when a voltage found by subtracting a voltage held by the piezoelectric element from the voltage of the control signal is multiplied by a predetermined number. According to the above aspect, a negative feedback control makes it possible to cause the voltage held in the piezoelectric element to track the voltage of an input signal with high accuracy and in a short time.

BRIEF DESCRIPTION OF THE DRAWINGS

Referring now to the attached drawings which form a part of this original disclosure:

FIGS. 12A and 12B are drawings for describing loss during charging and discharging of a driver;

DETAILED DESCRIPTION OF EXEMPLARY EMBODIMENTS

First Embodiment

Figure 1:
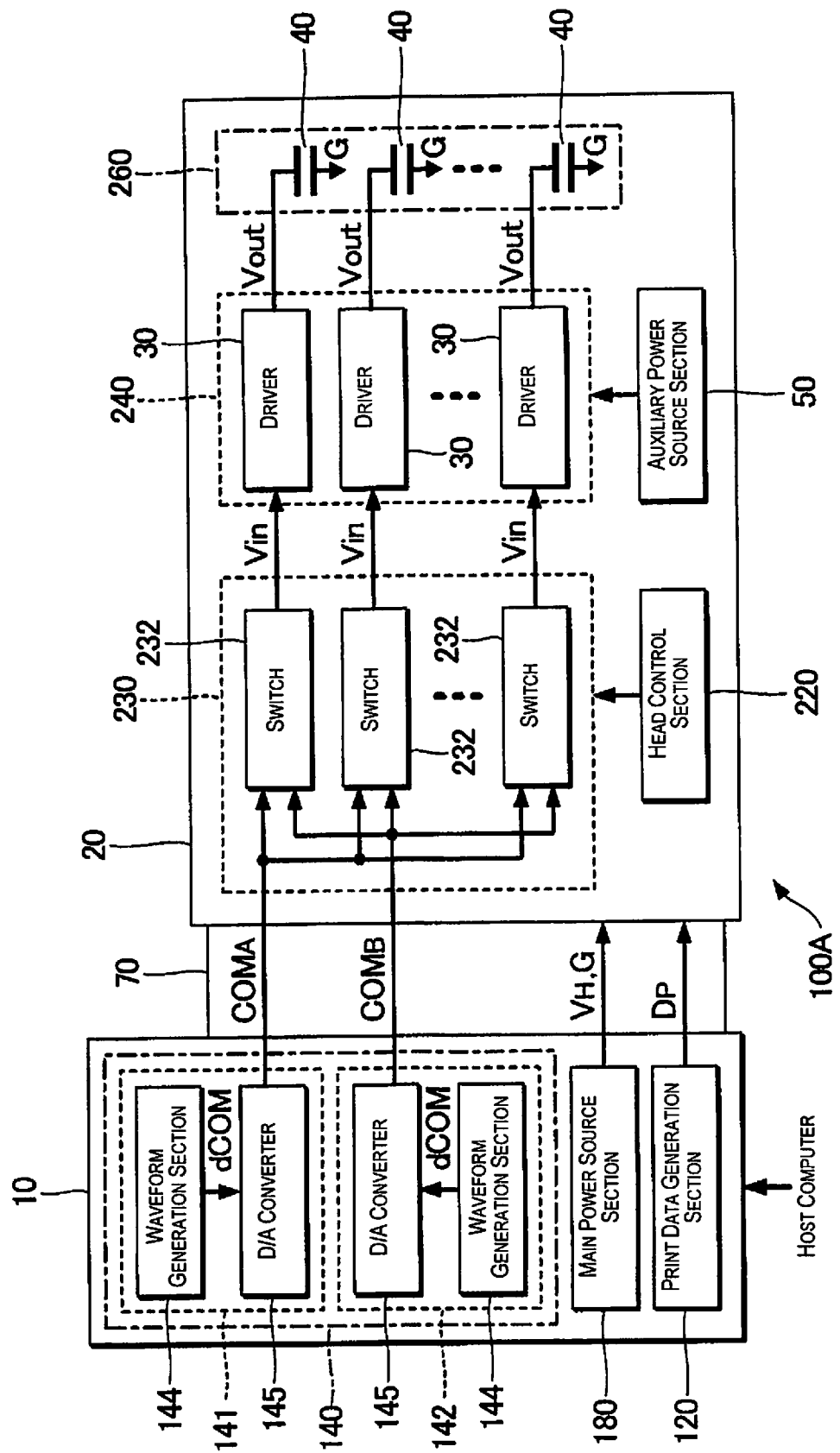
FIG. 1 is a drawing illustrating a schematic configuration of a print apparatus.

FIG. 1 is a block diagram of a print apparatus 100A as in a first embodiment of the present invention. The print apparatus 100A of the first embodiment is a liquid discharge for printing an image on a recording medium such as print paper by discharging droplets of ink ("ink droplets") onto the recording medium.

As illustrated in FIG. 1, the print apparatus 100A is equipped with a control unit 10, a print head 20, and a flexible flat cable (FFC) 70. The ink droplets are discharged onto the recording medium from each of a plurality of nozzles of the print head 20, on the basis of a control by the control unit 10. The print apparatus 100A of the first embodiment is a serial-type inkjet printer in which the print head 20 is mounted onto a carriage (not shown) for moving in a direction (main scanning direction) that intersects with a direction of conveyance (secondary scanning direction) of the recording medium. The control unit 10 is arranged on a control substrate (not shown) outside of the carriage. The FFC 70 is a flexible wiring substrate for electrically connecting the control unit 10 and the print head 20.

The control unit 10 is an element for executing a computational process and control process for printing an image that has been designated with image data supplied from a host computer (not shown), and is equipped with a print data generation section 120, a control signal supply section 140, and a main power source section 180.

The main power source section 180 generates a power source voltage $V_H$ and a ground potential (grounding) G. The ground G is equivalent to a reference value for voltage (voltage zero), and the power source voltage $V_H$ is a voltage on a high side of the ground G. The power source voltage $V_H$ and the ground G are supplied to the print head 20 via the FFC 70.

The print data generation section 120 and the control signal supply section 140 in FIG. 1 are implemented by, for example, a computational processing device (central processing unit (CPU)) and a variety of logic circuits for executing programs stored in a storage circuit such as a RAM. An element for controlling a conveyance mechanism for conveying the recording medium and an element for controlling a movement mechanism for moving the carriage are also installed in the control unit 10, but FIG. 1 omits depictions thereof for the sake of convenience.

The print data generation section 120 generates print data DP by executing a variety of computational processes (for example, an image development process, color conversion process, color separation process, halftone process, and the like) on the image data that is supplied from the host computer. The print data DP specifies, for every nozzle of the print head 20, whether or not ink droplets are to be discharged, and the amount of ink droplets discharged. The print data DP generated by the print data generation section 120 is supplied to the print head 20 via the FFC 70.

The control signal supply section 140 generates control signals COM (COMA, COMB) for causing the ink droplets to be discharged from each of the nozzles of the print head 20. The control signal supply section 140 of the first embodiment is configured so as to comprise a first generation section 141 for generating the control signal COMA and a second generation section 142 for generating the control signal COMB.

Each of the first generation section 141 and the second generation section 142 is equipped with a waveform generation section 144 for generating a digital control signal dCOM and a D/A converter 145 for converting the control signal dCOM into the analog control signals COM (COMA, COMB). As is illustratively exemplified in FIG. 2, each of the control signal COMA and the control signal COMB is a voltage signal in which a plurality of drive pulses are arranged in time series in every print cycle (one cycle) Ta. The control signal COMA and the control signal COMB have different waveforms. It would also be possible to employ a configuration in which only the one system of the control signal COM is supplied to the print head 20 from the control unit 10, or a configuration in which the control signal COMA and the control signal COMB are each supplied to the print head 20 from the control unit 10 as differential signals.

As illustrated in FIG. 1, the print head 20 is equipped with a head control section 220, a selection section 230, an element drive section 240, an auxiliary power source section 50, and a piezoelectric element group 260. The piezoelectric element group 260 is equipped with a plurality of piezoelectric elements 40 that correspond to different nozzles. Each of the piezoelectric elements 40 is a capacitive load that is arranged in a cavity (ink chamber) to which ink is supplied via a flow path. Charging and discharging by the supply of voltages causes the piezoelectric elements 40 to deform and the volume of the cavity to vary, as a result of which the ink droplets are discharged from the nozzles corresponding to the piezoelectric elements 40.

Figure 3:
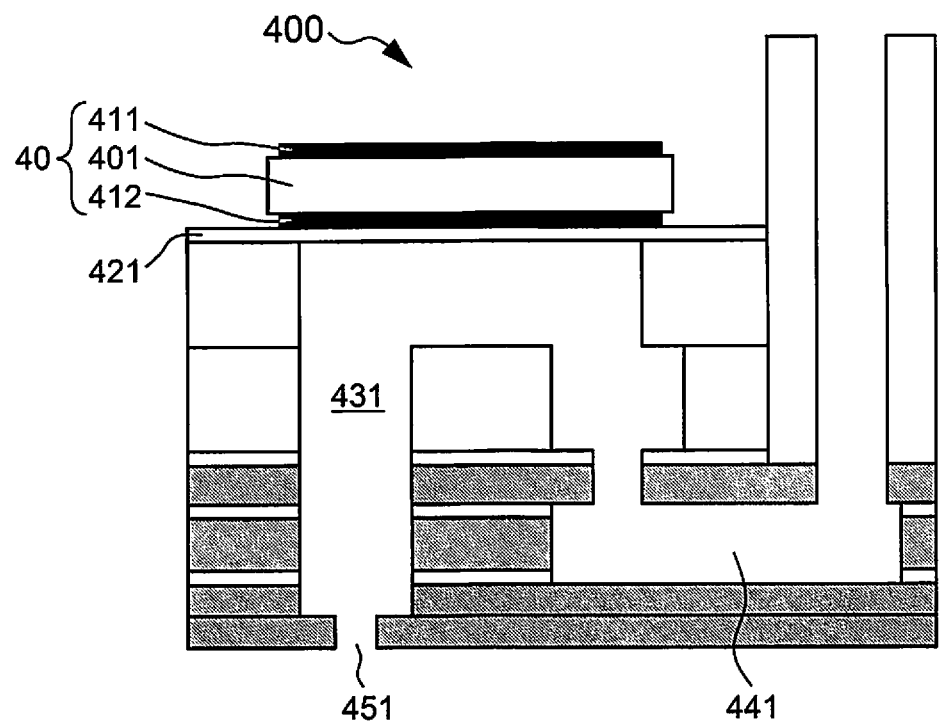
FIG. 3 is a drawing illustrating the principal configuration of a discharge section in a print head.

FIG. 3 is a drawing illustrating the schematic configuration of a discharge section 400 corresponding to one nozzle worth of the print head 20. As illustrated in FIG. 3, the discharge section 400 comprises a piezoelectric element 40, a diaphragm 421, a cavity (pressure chamber) 431, a reservoir 441, and a nozzle 451. Of these, the diaphragm 421 is deformed by the piezoelectric element 40, which is provided to an upper surface in FIG. 3, and expands or reduces the internal volume of the cavity 431, which is filled with ink. The nozzle 451 is an opening that communicates with the cavity 431.

The piezoelectric element 40 illustrated in FIG. 3 is typically a structure called a unimorph (monomorph) type, in which a piezoelectric body 401 is interposed between a pair of electrodes 411, 412. In the piezoelectric body 401 of this structure, a middle portion in FIG. 3 is warped in the vertical direction, with respect to both end portions, along with the electrodes 411, 412 and the diaphragm 421 in accordance with a voltage applied between the electrodes 411, 412. Here, in upward warping, the internal volume of the cavity 431 is expanded, and thus the ink is drawn in from the reservoir 441, whereas with downward warping, the internal volume of the cavity 431 is expanded, and thus the ink is discharged from the nozzle 451. The piezoelectric element 40 is not limited to being the unimorph type, however, and need only be a type, such as a bimorph type or laminated type, with which the piezoelectric element can be deformed to discharge a liquid such as ink.

The element drive section 240 is an element for driving each of the plurality of piezoelectric elements 40, and is configured so as to comprise a plurality (the same number as that of the piezoelectric elements 40) of drivers 30 corresponding to the different piezoelectric elements 40 of the piezoelectric element group 260, as illustrated in FIG. 1. That is to say, each of the drivers 30 of the element drive section 240 and each of the piezoelectric elements 40 of the piezoelectric element group 260 have a one-to-one correspondence, and the print head 20 comprises a plurality of the sets of the piezoelectric elements 40 and the drivers 30. One end of each of the piezoelectric elements 40 is connected to an output end of the driver 30 corresponding to the relevant piezoelectric element 40, and the other end of each of the piezoelectric elements 40 is grounded to the ground G.

The selection section 230 is equipped with a plurality (the same number as that of the piezoelectric elements 40) of switches 232 corresponding to the different piezoelectric elements 40. Each of the switches 232 is in one-to-one correspondence with each of the sets of the drivers 30 and the piezoelectric elements 40. Supplied in common to an input end of each of the switches 232 of the selection section 230 are the control signal COMA and the control signal COMB generated by the control signal supply section 140, and an output end of each of the switches 232 is connected to the input end of the driver 30 corresponding to the relevant switch 232. Each of the switches 232 selects either the control signal COMA or the control signal COMB and supplies same to the driver 30.

Figure 2:
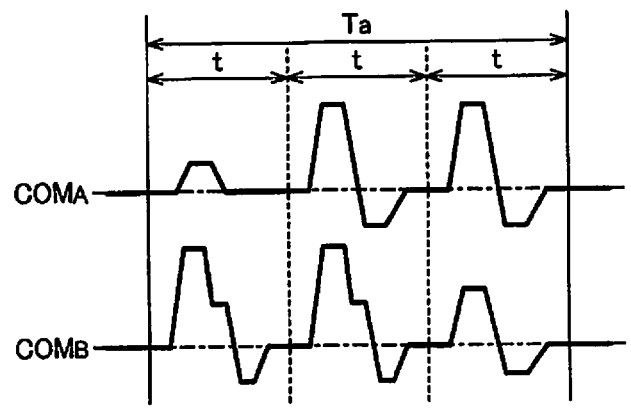
FIG. 2 is a drawing for describing a control signal.

The head control section 220 of FIG. 1 controls each of the plurality of switches 232 of the selection section 230 in accordance with the print data DP that is supplied from the print data generation section 120. More specifically, the head control section 220 selects either the control signal COMA or the control signal COMB for each of the switches 232 in each of a plurality of segments t obtained when the print cycle Ta of the control signal COMA and the control signal COMB is divided on the time axis, as illustrated in FIG. 2. As such, a control signal Vin, obtained when either the control signal COMA or the control signal COMB is selectively extracted for every segment t, is supplied from the switches 232 to the drivers 30 of the subsequent stage.

Figure 4:
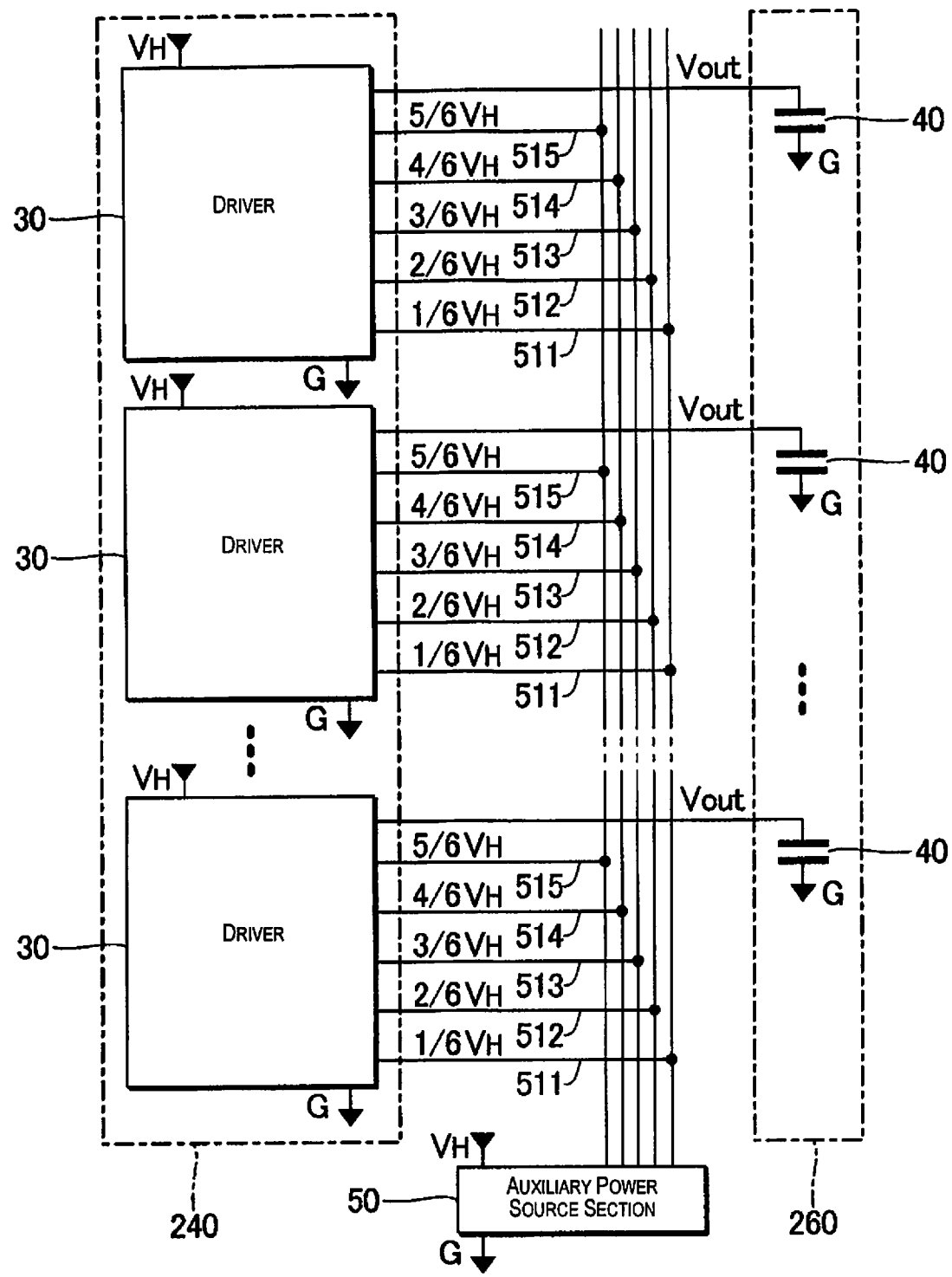
FIG. 4 is a partial block diagram of a print head.

The auxiliary power source section 50 of FIG. 1 is a voltage generation section (step-up circuit) for utilizing the voltage $V_H$ supplied from the main power source section 180 of the control unit 10 to generate a plurality of voltages. The auxiliary power source section 50 of the first embodiment uses a charge pump circuit to divide and redistribute the voltage $V_H$, thereby generating a voltage ($V_H/6$) that is a factor of 1/6 of the relevant voltage $V_H$, a voltage ($2V_H/6$) that is a factor of 2/6 thereof, a voltage ($3V_H/6$) that is a factor of 3/6 thereof, a voltage ($4V_H/6$) that is a factor of 4/6 thereof, and a voltage ($5V_H/6$) that is a factor of 5/6 thereof, as is illustrated in FIG. 4. The plurality of voltages generated by the auxiliary power source section 50 are supplied in common to the plurality of drivers 30 of the element drive section 240. That is to say, the plurality of drivers 30 share the auxiliary power source section 50. Each of the drivers 30 is a circuit (connection path selection section) for utilizing the plurality of voltages supplied from the auxiliary power source section 50 to drive the piezoelectric elements in accordance with the control signal Vin supplied from the selection section 230. More specifically, a voltage Vout that varies tracking the voltage of the control signal Vin is supplied to the piezoelectric elements 40 from each of the drivers 30. Because one end of the piezoelectric elements 40 is grounded, the voltage Vout is equivalent to a voltage held by the piezoelectric elements 40.

Driver

Figure 5:
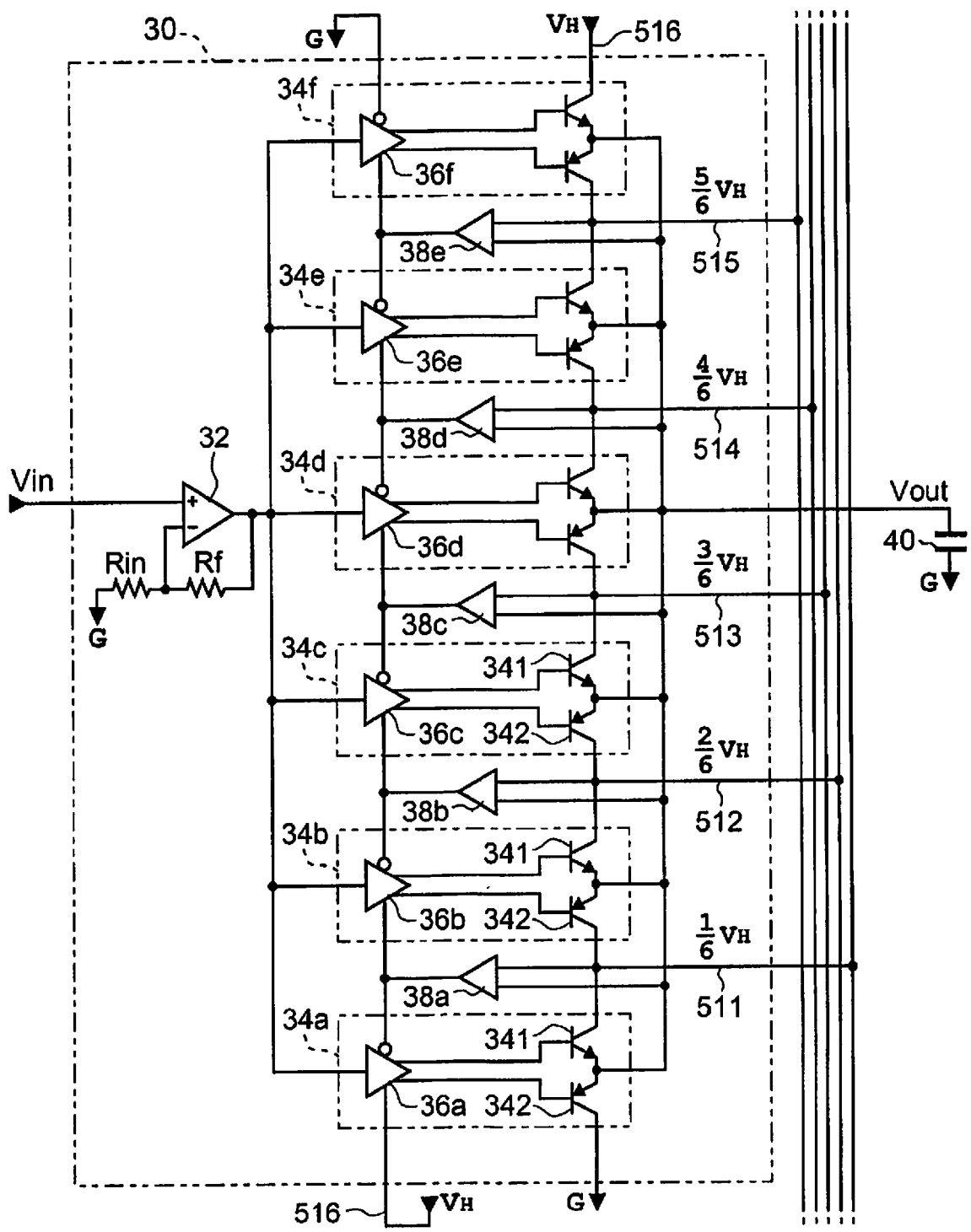
FIG. 5 is a drawing illustrating one example of the configuration of a driver in a print head.

FIG. 5 is a drawing illustrating one example of the configuration of the driver 30 for driving one piezoelectric element 40 in the first embodiment. As illustrated in FIG. 5, including voltage zero, the driver 30 utilizes seven types of voltage—more specifically, voltage zero (ground G), $V_H/6$, $2V_H/6$, $3V_H/6$, $4V_H/6$, $5V_H/6$, $V_H$, in ascending—to generate the voltage Vout. The voltage $V_H/6$ is supplied to the driver 30 from the auxiliary power source section 50 via a power source wiring 511 and, similarly, the voltages $2V_H/6$, $3V_H/6$, $4V_H/6$, $5V_H/6$ are supplied to each of the drivers 30 from the auxiliary power source section 50 via power source wirings 512, 513, 514, 515. As illustrated in FIG. 5, the driver 30 comprises an operational amplifier 30, unit circuits 34a to 34f, and comparators 38a to 38e, and drives the piezoelectric element 40 in conformity with the control signal Vin.

The control signals Vin, which are outputted from the selection section 230, are supplied to an input end (+) of the operational amplifier 32, which is an input end of the driver 30. Output signals of the operational amplifier 32 are supplied to the unit circuits 34a to 34f, negatively fed back to an input end (−) of the operational amplifier 32 via a resistor Rf, and also grounded to the ground G via a resistor Rin. For this reason, the operational amplifier 32 non-invertingly amplifies the control signals Vin by a factor of (1+Rf/Rin).

The voltage amplification factor of the operational amplifier 32 can be set by the resistors Rf, Rin, but for the sake of convenience, Rf is understood to be zero and Rin is understood to be infinite below. That is to say, the following description understands the voltage amplification factor of the operational amplifier 32 to have been set to "1" and understands the control signals Vin to be supplied to the unit circuits 34a to 34f without alteration. The voltage amplification factor may be a number other than "1".

The unit circuits 34a to 34f are provided in ascending order of voltage so as to correspond to two mutually adjacent voltages out of the aforementioned types of voltages. More specifically, the unit circuit 34a is provided so as to correspond to voltage zero and the voltage $V_H/6$, the unit circuit 34b is provided so as to correspond to the voltage $V_H/6$ and the voltage $2V_H 6$, the unit circuit 34c is provided so as to correspond to the voltage $2V_H/6$ and the voltage $3V_H/6$, the unit circuit 34d is provided so as to correspond to the voltage $3V_H/6$ and the voltage $4V_H/6$, the unit circuit 34e is provided so as to correspond to the voltage $4V_H/6$ and the voltage $5V_H/6$, and the unit circuit 34f is provided so as to correspond to the voltage $5V_H/6$ and the voltage $V_H$.

The circuitry configurations of the unit circuits 34a to 34f are mutually identical, and comprise whichever one respectively corresponds out of level shifters 36a to 36f, a bipolar NPN transistor 341, and a PNP transistor 342.

Where the unit circuits 34a to 34f are described in general rather than specific terms, then the description shall simply relate to a reference numeral "34"; likewise, where the level shifters 36a to 36f are described in general rather than specific terms, then the description shall simply relate to a reference numeral "36".

The level shifters 36 take either an enable state or a disable state. More specifically, the level shifters 36 are in the enable state when the signal supplied to a negative control end, marked with a circle, is an L level and the signal supplied to a positive control end, not marked with a circle, is an H level; at all other times, the level shifters 36 are in the disable state.

As will be described below, out of the aforementioned seven types of voltages, each of the comparators 38a to 38e is associated by pairs with five types of voltages, excluding voltage zero and the voltage $V_H$. Focusing herein on a given unit circuit 34, the output signal of the comparator associated with a high-side voltage out of the two voltages associated with the relevant unit circuit 34 is supplied to the negative control end of the level shifter 36 in the relevant unit circuit 34, and the output signal of the comparator associated with a low-side voltage out of the two voltages associated with the relevant unit circuit is supplied to the positive control end of the level shifter 36. The negative control end of the level shifter 36f in the unit circuit 34f is grounded to the ground G of voltage zero, equivalent to the L level, and the positive control end of the level shifter 36a in the unit circuit 34a is connected to the power source wiring 516, which supplies the voltage $V_H$, equivalent to the H level.

The level shifters 36, when in the enable state, shift the voltage of the inputted control signals Vin by a predetermined value in a minus direction and supply the shifted voltage to a base terminal of the transistors 341, and in turn shift the voltage of the control signals Vin by a predetermined value in a plus direction and supply the shifted voltage to a base terminal of the transistor 342. Irrespective of the control signals Vin, the level shifters 36 when in the disable state supply a voltage for turning the transistors 341 off, e.g., the voltage $V_H$ to the base terminals of the relevant transistors 341, and supply a voltage for turning the transistors 342 off, e.g., voltage zero to the base terminals of the relevant transistors 342.

The predetermined value is understood to be a voltage (bias voltage, about 0.6 V) between a base and emitter, at which a current begins to flow to an emitter terminal. For this reason, the predetermined value is a quality determined in accordance with the properties of the transistors 341, 342, and is zero provided that the transistors 341, 342 are ideal.

A collector terminal of the transistor 341 is connected to the power source wiring that supplies the high-side voltage out of the two corresponding voltages, and a collector terminal of the transistor 342 is connected to the power source wiring that supplies the low-side voltage. In, for example, the unit circuit 34a, which corresponds to voltage zero and the voltage $V_H/6$, the collector terminal of the transistor 341 is connected to the power source wiring 511, which supplies the voltage $V_H/6$, and the collector terminal of the transistor 342 is grounded to the ground G of voltage zero. In another example, in the unit circuit 34b, which corresponds to the voltage $V_H/6$ and the voltage $2V_H/6$, the collector terminal of the transistor 341 is connected to the power source wiring 512, which supplies the voltage $2V_H/6$, and the collector terminal of the transistor 342 is connected to the power source wiring 511, which supplies the voltage $V_H/6$. In the unit circuit 34f, which corresponds to the voltage $5V_H/6$ and the voltage $V_H$, the collector terminal of the transistor 341 is connected to the power source wiring 516, which supplies the voltage $V_H$, and the collector terminal of the transistor 342 is connected to the power source wiring 515, which supplies the voltage $5V_H/6$.

In turn, in the unit circuits 34a to 34f, emitter terminals of the transistors 341, 342 share a connection to one end of the piezoelectric element 40. For this reason, the common connection point of the emitter terminals of the transistors 341, 342 is connected to the one end of the piezoelectric element 40 as an output end of the driver 30.

Out of the aforementioned seven types of voltages, the comparators 38a to 38e correspond to five types of voltages $V_H/6$, $2V_H/6$, $3V_H/6$, $4V_H/6$, $5V_H/6$, $V_H$, excluding voltage zero and the voltage $V_H$, and compare the relative levels of voltages supplied to the two input ends and output a signal indicative of the comparison result. Herein, out of the two input ends in the comparators 38a to 38e, one end is connected to the power source wiring that supplies the voltage that corresponds thereto, and the other end shares a connection to the one end of the piezoelectric element 40, along with each of the emitter terminals of the transistors 341, 342. For example, in the comparator 38a, which corresponds to the voltage $V_H/6$, one end out of the two input ends is connected to the power source wiring 511, which supplies the voltage $V_H/6$ corresponding thereto; in another example, in the comparator 38b, which corresponds to the voltage $2V_H/6$, one end of the two input ends is connected to the power source wiring 512, which supplies the voltage $2V_H/6$ corresponding thereto.

Each of the comparators 38a to 38e outputs a signal which takes the H level when the voltage Vout of the other end at the input end is not less than the voltage of the one end, and takes the L level when the voltage Vout is less than the voltage of the one end.

More specifically, for example, the comparator 38a outputs a signal which takes the H level when the voltage Vout is not less than the voltage $V_H/6$, and takes the L level when the voltage Vout is less than the voltage $V_H/6$. As another example, the comparator 38b outputs a signal which takes the H level when the voltage Vout is not less than the voltage $2V_H/6$, and takes the L level when the voltage Vout is less than the voltage $2V_H/6$.

To focus now on one out of the five types of voltages, the output signal of the comparator corresponding to the relevant voltage of interest is supplied to both the negative input end of the level shifter 36 of the unit circuit for which the relevant voltage is the high-side voltage, and the positive input end of the level shifter 36 of the unit circuit for which the relevant voltage is the low-side voltage.

For example, the output signal of the comparator 38a, which corresponds to the voltage $V_H/6$, is supplied to the negative input end of the level shifter 36a of the unit circuit 34a, for which the relevant voltage $V_H/6$ is associated as the high-sigh voltage, and to the positive input end of the level shifter 36b of the unit circuit 34b, for which the relevant voltage $V_H/6$ is associated as the low-side voltage. As another example, the output signal of the comparator 38b, which corresponds to the voltage $2V_H/6$, is supplied to the negative input end of the level shifter 36b of the unit circuit 34b, for which the relevant voltage $2V_H/6$ is associated as the high-sigh voltage, and to the positive input end of the level shifter 36c of the unit circuit 34c, for which the relevant voltage $2V_H/6$ is associated as the low-side voltage.

Next, the operation of the driver 30 shall now be described.

First, the states reached by the comparators 38a to 38e and the level shifters 36 with respect to the voltage Vout, held by the piezoelectric element 40, shall be described.

In a state (first state) where the voltage Vout is between voltage zero and less than the voltage $V_H/6$, then the output signals of the comparators 38a to 38e are all at the L level. For this reason, in the first state, only the level shifter 36a is in the enable state, and the other level shifters 36b to 36f are in the disable state.

In a state (second state) where the voltage Vout is not less than the voltage $V_H/6$ but is less than the voltage $2V_H/6$, then the output signal of the comparator 38a is at the H level, and the output signals of the other comparators 38b to 38e are at the L level. For this reason, in the second state, only the level shifter 36b is in the enable state, and the other level shifters 36a, 36c to 36f are in the disable state.

In a state (third state) where the voltage Vout is not less than the voltage $2V_H/6$ but is less than the voltage $3V_H/6$, then the output signals of the comparators 38a, 38b are at the H level, and the output signals of the other comparators 38c to 38e are at the L level. For this reason, in the third state, only the level shifter 36c is in the enable state, and the other level shifters 36a, 36b, 36d to 36f are in the disable state.

In a state (fourth state) where the voltage Vout is not less than the voltage $3V_H/6$ but is less than the voltage $4V_H/6$, then the output signals of the comparators 38a, 38b, 38c are at the H level, and the output signals of the other comparators 38d to 38e are at the L level. For this reason, in the fourth state, only the level shifter 36d is in the enable state, and the other level shifters 36a to 36c, 36e, 36f are in the disable state.

In a state (fifth state) where the voltage Vout is not less than the voltage $4V_H/6$ but is less than the voltage $5V_H/6$, then the output signals of the comparators 38a to 38d are at the H level, and the output signal of the other comparator 38e is at the L level. For this reason, in the fifth state, only the level shifter 36e is in the enable state, and the other level shifters 36a to 36d, 36f are in the disable state.

In a state (sixth state) where the voltage Vout is not less than the voltage $5V_H/6$ but is less than the voltage $V_H$, then the output signals of the comparators 38a to 38e are all at the H level. For this reason, in the sixth state, only the level shifter 36f is in the enable state, and the other level shifters 36a to 36d are in the disable state.

Thus, in the first state, only the level shifter 36a is in the enable state. This continues in a similar manner, where only the level shifter 36b is in the enable state in the second state, only the level shifter 36c is in the enable state in the third state, only the level shifter 36d is in the enable state in the fourth state, only the level shifter 36e is in the enable state in the fifth state, and only the level shifter 36f is in the enable state in the sixth state.

The first state through sixth state have been defined with the voltage Vout, but this could also be stated in terms of the state of charge held (stored) in the piezoelectric element 40.

When the level shifter 36a is in the enable state in the first state, then the relevant level shifter 36a supplies a voltage signal obtained when the control signal Vin has been level-shifted by a predetermined value in the minus direction to the base terminal of the transistor 341 in the unit circuit 34a, and supplies a voltage signal obtained when the control signal Vin has been level-shifted by a predetermined value in the plus direction to the base terminal of the transistor 342 in the relevant unit circuit 34a.

Herein, when the voltage of the control signal Vin is higher than the voltage Vout (connection point voltage between the emitter terminals), then a current corresponding to the difference thereof (the voltage between base and emitter; in a stricter sense, a voltage reduced by a predetermined value from the voltage between base and emitter) flows to the emitter terminal from the collector terminal of the transistor 341. For this reason, the voltage Vout gradually rises and approaches the voltage of the control signal Vin, and when the voltage Vout eventually matches the voltage of the control signal Vin, then the current flowing to the transistor 341 at this point in time is zero.

In turn, when the voltage of the control signal Vin is less than the voltage Vout, then a current corresponding to the difference flows to the collector terminal from the emitter terminal of the transistor 342. For this reason, the voltage Vout gradually lowers and approaches the voltage of the control signal Vin, and when the voltage Vout eventually matches the voltage of the control signal Vin, then the current flowing to the transistor 342 at this point in time is zero.

As such, in the first state, the transistors 341, 342 of the unit circuit 34a will execute such a control as to match the voltage Vout to the control signal Vin.

In the first state, because the level shifters 36 are in the disable state in the unit circuits 34b to 34f other than the unit circuit 34a, the voltage $V_H$ is supplied to the base terminals of the transistors 341, and voltage zero is supplied to the base terminals of the transistors 342. For this reason, in the first state, the transistors 341, 341 are off in the unit circuits 34b to 34f, and therefore are not involved in the control of the voltage Vout.

The description herein is of when the first state is in effect, but the operation will be similar in the second state through sixth state, as well. More specifically, one of the unit circuits 34a to 34f is enabled, depending on the voltage Vout held by the piezoelectric element 40, and the transistors 341, 342 of the enabled unit circuit implement a control so as to match the voltage Vout to the control signal Vin. For this reason, when the driver 30 is viewed as a whole, the operation is one where the voltage Vout tracks the voltage of the control signal Vin.

Figure 6A:
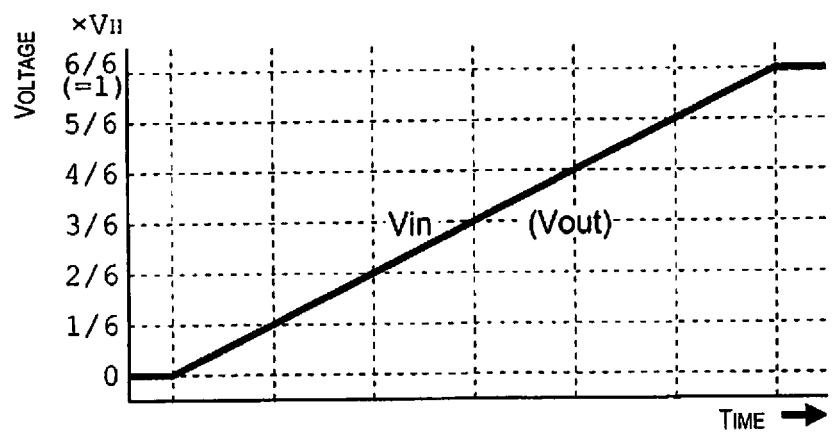
FIGS. 6A and 6B are diagrams for describing the operation of a driver.
Figure 6B:
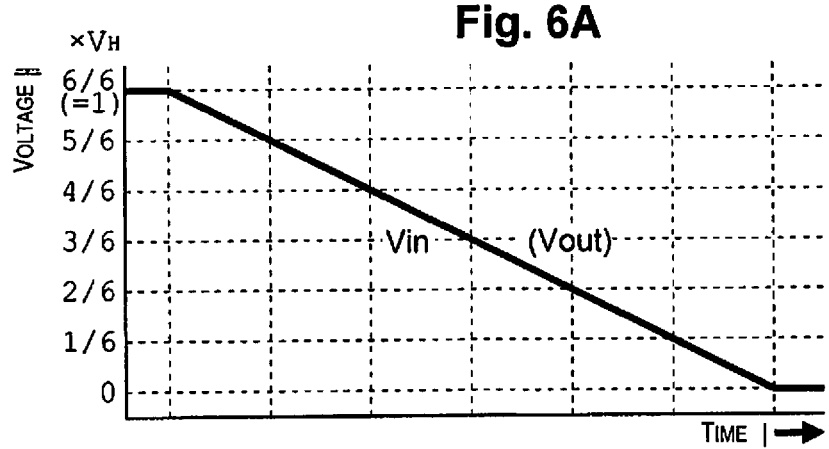

As such, as illustrated in FIG. 6A, when the control signal Vin rises, for example, from voltage zero to the voltage $V_H$, then the voltage Vout also tracks the control signal Vin and changes from voltage zero to the voltage $V_H$. As illustrated in FIG. 6B, when the control signal Vin lowers from the voltage $V_H$ to voltage zero, then the voltage Vout also tracks the control signal Vin and changes from the voltage $V_H$ to voltage zero.

Figure 7A:
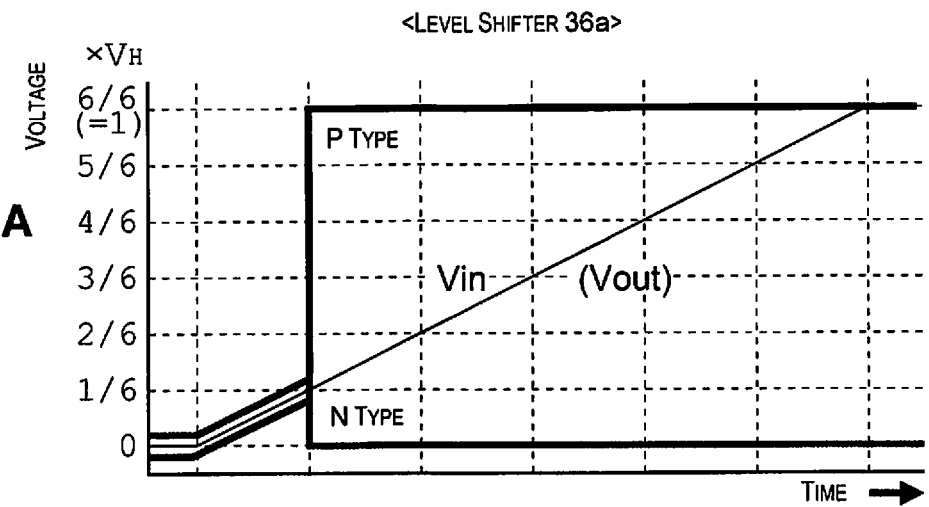
FIGS. 7A to 7C are drawings for describing the operation of a level shifter in a driver.
Figure 7B:
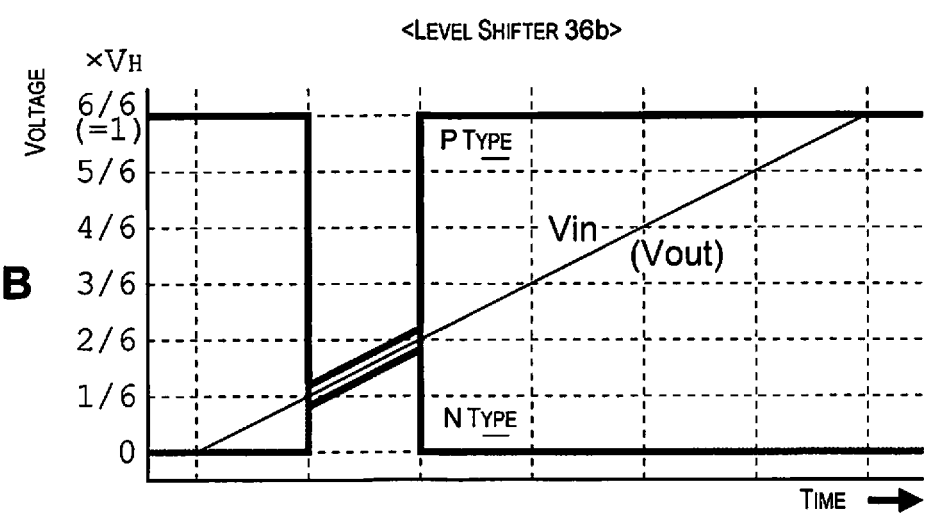
Figure 7C:
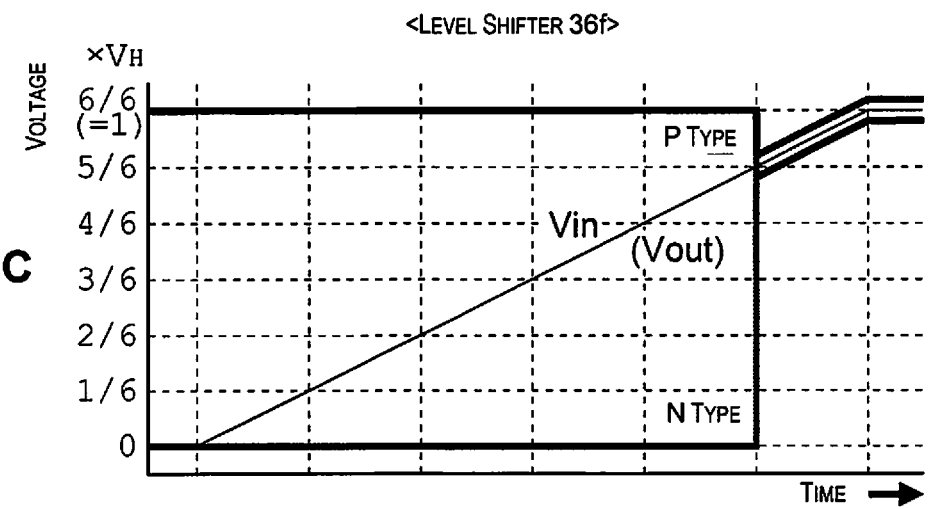

FIGS. 7A to 7C are drawings for describing the operation of the level shifters.

When the voltage of the control signal Vin changes, rising from voltage zero to the voltage $V_H$, the voltage Vout also tracks the control signal Vin and rises. In the course of this rise, the level shifter 36a is in the enable state when the first state, where the voltage Vout is between voltage zero and less than the voltage $V_H/6$, is in effect. For this reason, as illustrated in FIG. 7A, the voltage (denoted by "P-type") that is supplied to the base terminal of the transistor 341 by the level shifter 36a is a voltage obtained when the control signal Vin has been shifted by a predetermined value in the minus direction, and the voltage (denoted by "N-type") that is supplied to the base terminal of the transistor 342 is a voltage obtained when the control signal Vin has been shifted by a predetermined value in the plus direction. When a state other than the first state is in effect, however, then the level shifter 36a is in the disable state, and therefore the voltage that is supplied to the base terminal of the transistor 341 is $V_H$, and the voltage that is supplied to the base terminal of the transistor 342 is zero.

FIG. 7B illustrates a voltage waveform outputted by the level shifter 36b, and FIG. 7C illustrates a voltage waveform outputted by the level shifter 36f. No special description shall be needed provided that one remembers that the level shifter 36b is in the enable state when the second state, where the voltage Vout is between the voltage $2V_H/6$ and less than the voltage $2V_H/6$, is in effect, and that the level shifter 36f is in the enable state when the sixth state, where the voltage Vout is between the voltage $5V_H/6$ and less than the voltage $V_H$, is in effect.

The description shall also forgo describing the operation of the level shifters 36c to 36e in the course of rising of the voltage of the control signal Vin (or the voltage Vout), and describing the operation of the level shifters 36a to 36f in the course of lowering of the voltage of the control signal Vin (or the voltage Vout).

Next, the flow of current (charge) in the unit circuits 34a to 34f shall be described, taking the unit circuits 34a, 34b by way of example, and divided between during charging and during discharging.

Figure 8:
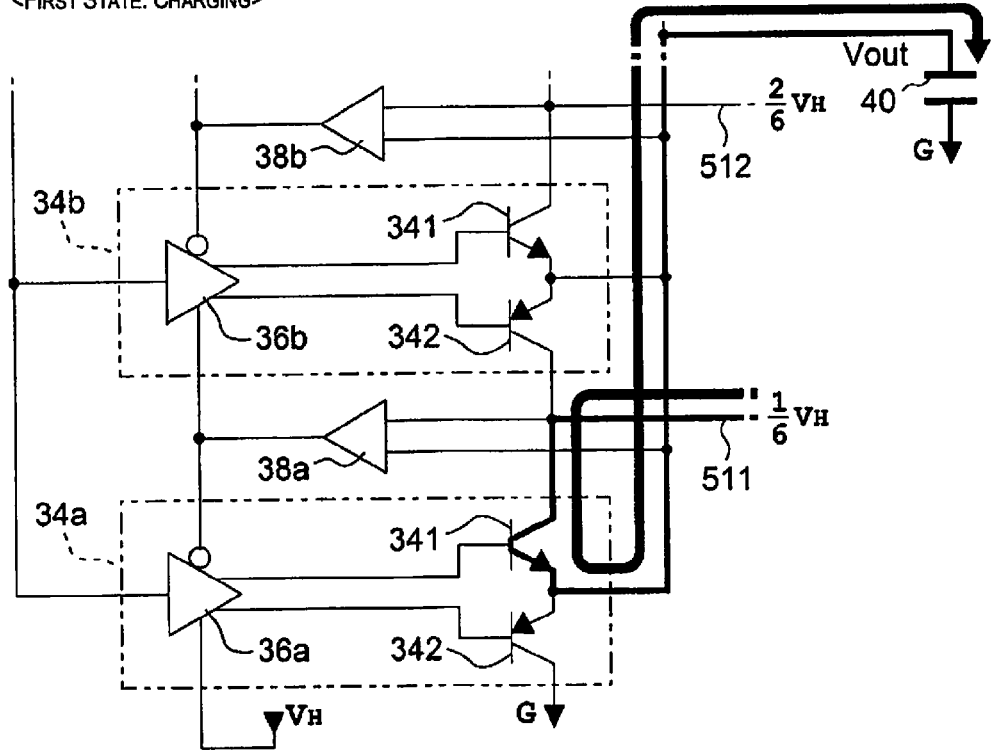
FIG. 8 is a drawing for describing the flow of an electrical current (charge) in a driver.

FIG. 8 is a drawing illustrating the operation of when the piezoelectric element 40 is charged when the first state (a state where the voltage Vout is between voltage zero and less than the voltage $V_H/6$) is in effect.

In the first state, the level shifter 36a is in the enable state and the other level shifters 36b to 36f are in the disable state, and therefore it suffices to focus only on the unit circuit 34a.

When the voltage of the control signal Vin is higher than the voltage Vout in the first state, then a current corresponding to the voltage between base and emitter flows through the transistor 341 of the unit circuit 34a. As such, the transistor 341 of the unit circuit 34a will function as a first transistor. At this time, the transistor 342 of the unit circuit 34a is off.

At this time, the electrical current flows in a path that goes from the power source wiring 511→the transistor 341 (of the unit circuit 34a)→the piezoelectric element 40, as illustrated by the arrow in FIG. 8, thus charging the piezoelectric element 40 with a charge. This charging causes the voltage Vout to rise.

When the voltage Vout matches the voltage of the control signal Vin, the transistor 341 of the unit circuit 34a is off, and therefore the charging of the piezoelectric element 40 is stopped.

However, in a case where the control signal Vin rises to the voltage $V_H/6$ or higher, then the voltage Vout also tracks the control signal Vin and therefore reaches the voltage $V_H/6$ or higher as well, and a transition is made from the first state to the second state (a state where the voltage Vout is between the voltage $V_H/6$ and less than the voltage $2V_H/6$).

Figure 9:
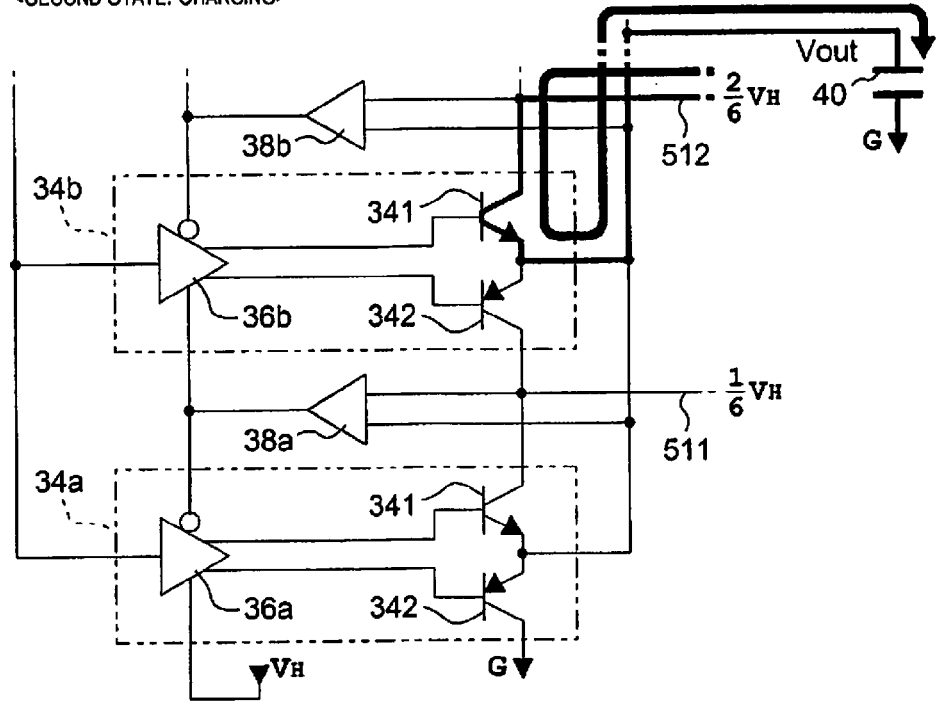
FIG. 9 is a drawing for describing the flow of an electrical current (charge) in a driver.

FIG. 9 is a drawing illustrating the operation of when the piezoelectric element 40 is charged in the second state.

In the second state, the level shifter 36b is in the enable state and the other level shifters 36a, 36c to 36f are in the disable state, and therefore it suffices to focus only on the unit circuit 34b.

When the voltage of the control signal Vin is higher than the voltage Vout in the second state, then a current corresponding to the voltage between base and emitter flows through the transistor 341 of the unit circuit 34b. As such, the transistor 341 of the unit circuit 34b will function as a third transistor. At this time, the transistor 342 of the unit circuit 34b is off.

At this time, the electrical current flows in a path that goes from the power source wiring 512→the transistor 341 (of the unit circuit 34b)→the piezoelectric element 40, as illustrated by the arrow in FIG. 9, thus charging the piezoelectric element 40 with a charge. That is to say, in a case where the piezoelectric element 40 is charged in the second state, one end of the piezoelectric element 40 is electrically connected to the auxiliary power source section 50 via the power source wiring 512.

Thus, when a transition is made from the first state to the second state during rising of the voltage Vout, then the source of supply of the electric current is switched from the power source wiring 511 to the power source wiring 512.

When the voltage Vout matches the voltage of the control signal Vin, the transistor 341 of the unit circuit 34b is off, and therefore the charging of the piezoelectric element 40 is stopped.

However, in a case where the control signal Vin rises to the voltage $2V_H/6$ or higher, then the voltage Vout also tracks the control signal Vin and therefore reaches the voltage $2V_H/6$ or higher as well, as a result of which a transition is made from the second state to the third state (a state where the voltage Vout is between the voltage $2V_H/6$ and less than the voltage $3V_H/6$).

In the charging operation from the third state to the sixth state, though not shown, the source of supply of the electrical current is switched in a stepwise manner to the power source wirings 513, 514, 515, 516.

Figure 10:
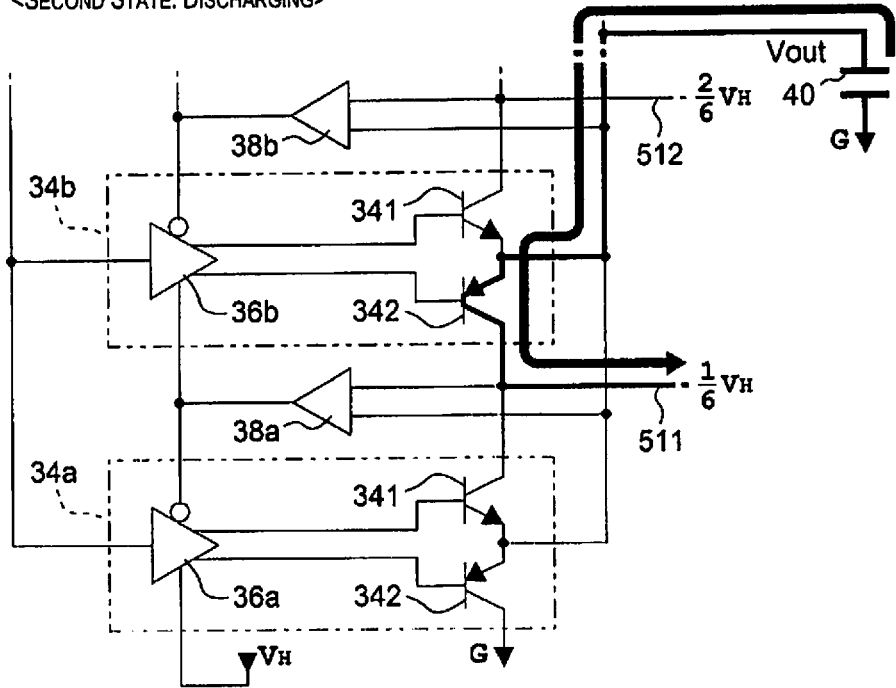
FIG. 10 is a drawing for describing the flow of an electrical current (charge) in a driver.

FIG. 10 is a drawing illustrating the operation of when the piezoelectric element 40 is discharged when the second state is in effect.

In the second state, the level shifter 36b is in the enable state. When the voltage of the control signal Vin is lower than the voltage Vout in this state, then a current corresponding to the voltage between base and emitter flows through the transistor 342 of the unit circuit 34b. As such, the transistor 341 of the unit circuit 34b will function as a second transistor. At this time, the transistor 341 of the unit circuit 34b is off.

At this time, the electrical current flows in a path that goes from the piezoelectric element 40→the transistor 342 (of the unit circuit 34b)→the power source wiring 511, as illustrated by the arrow in FIG. 10, thus discharging the charge from the piezoelectric element 40. That is to say, in a case where the piezoelectric element 40 is charged with a charge in the first state, and in a case where a charge is discharged from the piezoelectric element 40 in the second state, then one end of the piezoelectric element 40 is electrically connected to the auxiliary power source section 50 via the power source wiring 511. Further, the power source wiring 511 supplies a current (charge) during charging in the first state, and recovers a current (charge) during discharging of the second state.

The recovered charge is redistributed for reuse by the auxiliary power source section 50 (described below).

When the voltage Vout matches the control signal Vin, the transistor 342 of the unit circuit 34b is off and therefore discharging of the piezoelectric element 40 is stopped.

However, in a case where the control signal Vin falls to less than the voltage $V_H/6$, then the voltage Vout also tracks the control signal Vin and therefore reaches less than the voltage $V_H/6$ as well, and a transition is made from the second state to the first state.

Figure 11:
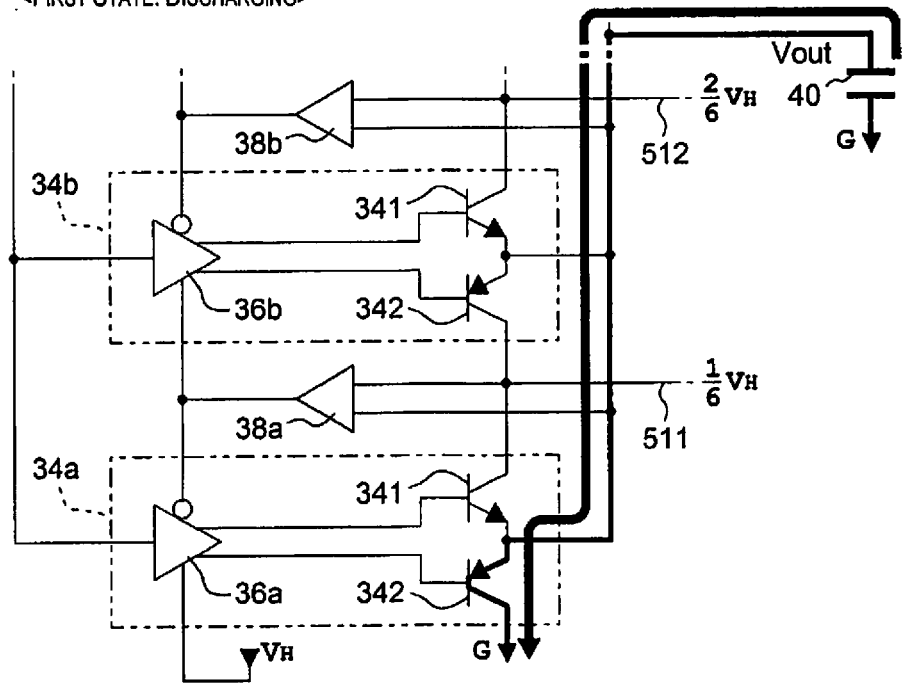
FIG. 11 is a drawing for describing the flow of an electrical current (charge) in a driver.

FIG. 11 is a drawing illustrating the operation of when the piezoelectric element 40 is discharged when the first state is in effect.

In the first state, the level shifter 36a is in the enable state. When the voltage of the control signal Vin is lower than the voltage Vout in this state, then a current corresponding to the voltage between base and emitter flows through the transistor 342 of the unit circuit 34a.

At this time, the transistor 341 of the unit circuit 34a is off.

At this time, the electrical current flows in a path that goes from the piezoelectric element 40→the transistor 342 (of the unit circuit 34a)→the ground G, as illustrated by the arrow in FIG. 11, thus discharging the charge from the piezoelectric element 40.

The description herein is of the unit circuits 34a, 34b by way of example, divided between during charging and during discharging, but the operation is substantially similar for the unit circuits 34c to 34f as well, except for the fact that the transistors 341, 342 controlling the current are different.

That is to say, the power source wiring 512 supplies the current (charge) during charging in the second state, and recovers the current (charge) during discharging in the third state, the power source wiring 513 supplies the current (charge) during charging in the third state, and recovers the current (charge) during discharging in the fourth state, the power source wiring 514 supplies the current (charge) during charging in the fourth state, and recovers the current (charge) during discharging in the fifth state, the power source wiring 515 supplies the current (charge) during charging in the fifth state, and recovers the current (charge) during discharging in the sixth state, and the power source wiring 516 supplies the current (charge) during charging in the sixth state.

The recovered charge is redistributed for reuse by the auxiliary power source section 50.

In the charge path and discharge path in each of the state, there is a common path from the one end of the piezoelectric element 40 to the connection points between emitter terminals in the transistors 341, 342.

Typically, the energy P that is stored in a capacitive load is represented by $$P=(C \cdot E^2)/2$$

where C is the capacitance of a capacitive load such as the piezoelectric element 40, and E is the voltage amplitude.

The piezoelectric element 40 works by being deformed by the energy P, but the amount of working for discharging the ink is 1% or less in relation to the energy P. As such, the piezoelectric element 40 can be regarded as a simple capacitance. When a capacitance C is charged at a constant power supply, energy equivalent to $(C \cdot E^2)/2$ is consumed by the charge circuit. During discharging, too, an equivalent energy is consumed by the discharge circuit.

Advantage of Driver

In the first embodiment, when the piezoelectric element 40 is charged from voltage zero to the voltage $V_H$, then charging takes place through six stages of:
from voltage zero to the voltage $V_H/6$,
from the voltage $V_H/6$ to the voltage $2V_H/6$,
from the voltage $2V_H/6$ to the voltage $3V_H/6$,
from the voltage $3V_H/6$ to the voltage $4V_H/6$,
from the voltage $4V_H/6$ to the voltage $5V_H/6$, and
from the voltage $5V_H/6$ to the voltage $V_H$.

For this reason, in the first embodiment, the loss during charging is merely an amount corresponding to the surface area of the region that has hatching in FIG. 12A. More specifically, in the first embodiment, the loss during charging in the piezoelectric element 40 is merely 6/36=(16.7%), compared to the linear amplification for charging from voltage zero to the voltage $V_H$ in a single burst.

In turn, because discharging is also stepwise in the first embodiment, the loss during discharging is likewise merely 6/36 (=16.7%), compared to the linear format for discharging from the voltage $V_H$ to voltage zero in one burst, as illustrated with the amount equivalent to the surface area of the region that has hatching in FIG. 12B.

The first embodiment also enables a further reduction of power consumption because of the redistribution and reuse of charge recovered by the auxiliary power source section 50 (described below), excluding cases of discharging from the voltage $V_H/6$ to voltage zero, out of the charge recorded as a loss during discharging.

With the configuration of patent document 1 (a "comparative example"), in which one system of control signals shared across a plurality of piezoelectric elements are selected individually by a switch of every nozzle and supplied directly to the piezoelectric elements, it is necessary to fully ensure the amount of current on the paths of the control signals in order for control signals of the proper waveform to be supplied to each of the piezoelectric elements even in a case where the control signals are supplied at the same time to a large number of piezoelectric elements. As such, each of the wirings that transmit the control signals and each of the switches that select the control signals is required to have ample withstand voltage performance and ample withstand current performance, and a problem arises in that it is difficult to reduce the scale of circuitry. In the first embodiment, because the above-described configurations and operations allow the drivers 30, installed for every piezoelectric element 40, to generate the voltage Vout from the control signal Vin and supply same to the piezoelectric elements 40, the amount of current on the paths of the control signals COM (COMA, COMB) is considerably reduced in comparison to the comparative example. As such, the withstand voltage performance and withstand current performance required for the wirings of the FFC 70 that transmits the control signals COM and each of the switches of the selection section 230 are reduced in comparison to the comparative example. That is to say, according to the first embodiment, it is possible to realize a reduction in the scale of circuitry. Another advantage lies in the fact that heat generation by the selection section 230 can be avoided, because each of the switches 232 of the selection section 230 does not consume power.

Class D amplification has a higher energy efficiency compared to linear amplification. This is due in part to the fact that that an active element of an output stage operates at a saturated state and consumes substantially no power, the fact that the exchange of magnetic energy created by an inductor L constituting a low-pass filter and energy created by a capacitance C prevent, during charging, the occurrence of such loss as with linear amplification, and the fact that the electrical current is regenerated to the power source with current switching during discharging.

However, actual class D amplification does have problems, among which the fact that the resistance of the active element of the output stage is not zero, even in the saturated state, the fact that there is leakage of the magnetic field, the fact that the resistance component of the inductor L causes loss to occur, and the fact that in some instances the inductor L is saturated during modulation.

Class D amplification also has problems in that the waveform quality is poor and EMI countermeasures are necessary. Though waveform quality can be improved by adding a dummy capacitance or filter, the increase entails a commensurate increase in power consumption and rise in costs. EMI derives from the fundamental problem of switching in class D amplification. That is to say, when a switch is made, not only does the current that flows during an on-time reach up to about a factor of several times or several tens of times that of linear amplification, but also the amount of magnetic field emitted in association therewith increases as well. Counteracting EMI requires adding a filter and the like, and entails higher costs.

The drivers 30 of the print apparatus as in the first embodiment do not suffer the problems of poor waveform quality and the need to counteract EMI, because the transistors 341, 342, which are equivalent to an output stage, do not engage in such switching as in class D amplification, and also because inductors L are not used.

Also, the first embodiment involves an operation where the voltage Vout tracks the voltage of the control signals Vin, and therefore fine voltage control is possible with respect to the piezoelectric elements 40. That is to say, the start voltage and end voltage of the voltage Vout applied to the piezoelectric elements 40 are unrelated to the voltages $V_H/6, 2V_H/6, 3V_H/6, 4V_H/6$, and $5V_H/6$ used for driving.

Auxiliary Power Source Section

Figure 13:
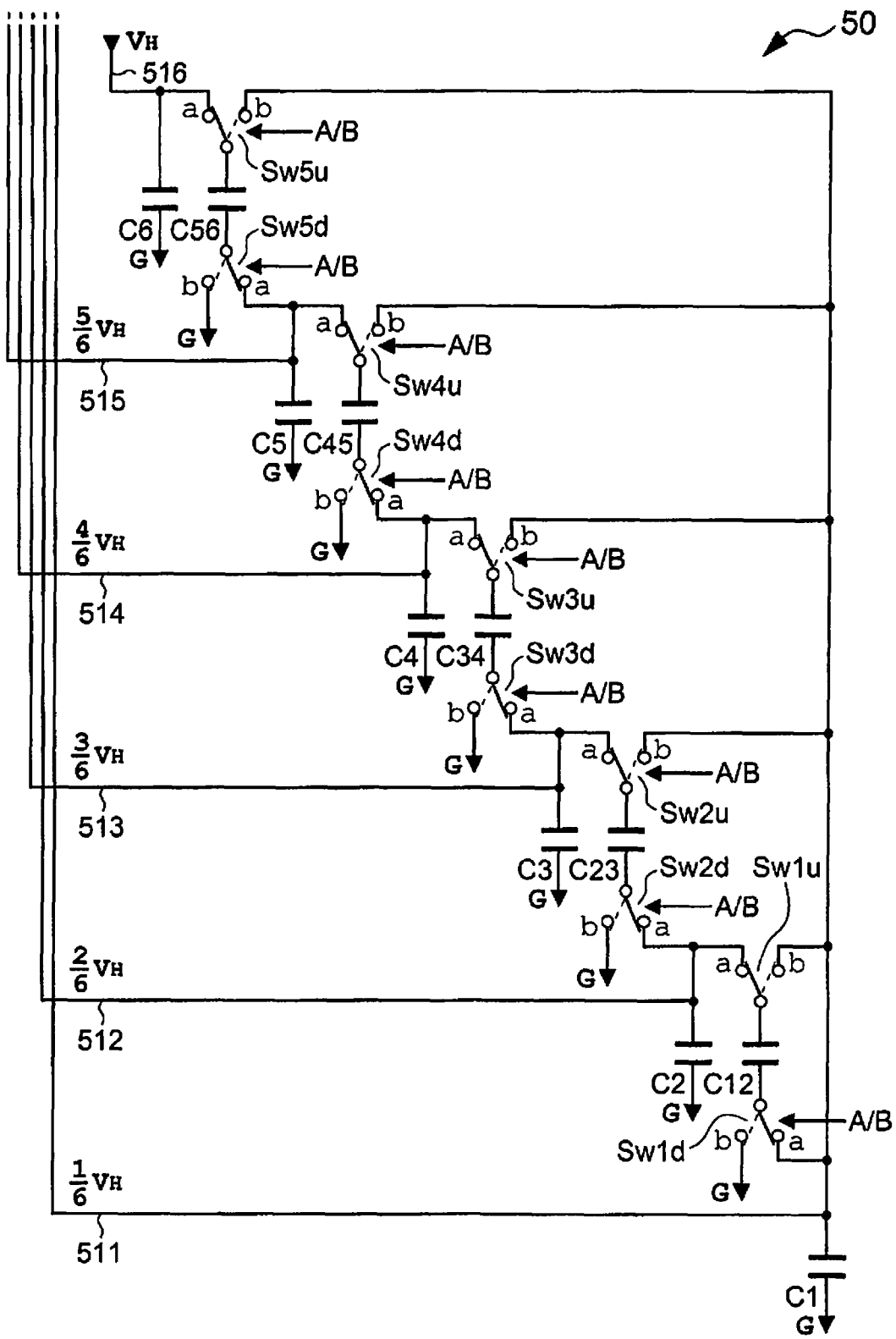
FIG. 13 is a drawing illustrating one example of the configuration of an auxiliary power source circuit.

FIG. 13 is a drawing illustrating one example of the configuration of the auxiliary power source section 50.

As illustrated in FIG. 13, the auxiliary power source section 50 has a configuration comprising: switches Sw1d, Sw1u, Sw2d, Sw2u, Sw3d, Sw3u, Sw4d, Sw4u, Sw5d, and Sw5u; and capacitive elements C12, C23, C34, C45, C56, C1, C2, C3, C4, C5, and C6.

Of these, the switches are all single-pole double-throw, and a shared terminal is connected to a terminal a or b in conformity with control signals A/B. When described in a simplified manner, the control signals A/B are pulse signals for which, for example, the duty ratio is about 50%, and the frequency thereof is set to, for example, a factor of about 20 in relation to the frequency of the control signals COM. The control signals A/B of such description may be generated by an internal oscillator (not shown) in the auxiliary power source section 50, or may be supplied from the control unit 10 via the FFC 70.

The capacitive elements C12, C23, C34, C45, C56, in turn are for charge transfer, and the capacitive elements C1, C2, C3, C4, C5 are for backup. The capacitive element C6 is for supplying the power source voltage $V_H$.

The switches are in fact configured by combining transistors in a semiconductor integrated circuit, and the capacitive elements are mounted externally with respect to this semiconductor integrated circuit. Preferably, the semiconductor integrated circuit also has the configuration formed with respect to the plurality of drivers 30 described above.

Next, the power source wiring 516 that supplies the voltage $V_H$ in the auxiliary power source section 50 is connected to one end of the capacitive element C6 and to a terminal a of the switch Sw5u. A shared terminal of the switch Sw5u is connected to one end of the capacitive element C56, and the other end of the capacitive element C56 is connected to a shared terminal of the switch Sw5d. The terminal a of the switch Sw5d is connected to one end of the capacitive element C5 and to the terminal a of the switch Sw4u. The shared terminal of the switch Sw4u is connected to one end of the capacitive element C45, and the other end of the capacitive element C45 is connected to the shared terminal of the switch Sw4d. The terminal a of the switch Sw4d is connected to one end of the capacitive element C4 and to the terminal a of the switch Sw3u. The shared terminal of the switch Sw3u is connected to one end of the capacitive element C34, and the other end of the capacitive element C34 is connected to the shared terminal of the switch Sw3d. The terminal a of the switch Sw3d is connected to one end of the capacitive element C3 and to the terminal a of the switch Sw2u. The shared terminal of the switch Sw2u is connected to one end of the capacitive element C23, and the other end of the capacitive element C23 is connected to the shared terminal of the switch Sw2d. The terminal a of the switch Sw2d is connected to one end of the capacitive element C2 and to the terminal a of the switch Sw1u. The shared terminal of the switch Sw1u is connected to one end of the capacitive element C12, and the other end of the capacitive element C12 is connected to the shared terminal of the switch Sw1d. The terminal a of the switch Sw1d is connected to one end of the capacitive element C1.

One end of the capacitive element C5 is connected to the power source wiring 515. Similarly, one end of the capacitive elements C4, C3, C2, C1 is connected to the power source wirings 514, 513, 512, 511, respectively.

Each of the terminals b of the switches Sw5u, Sw4u, Sw3u, Sw2u, Sw1u is connected to one end of the capacitive element C1 along with the terminal a of the switch Sw1d. Each of the other ends of the capacitive elements C6, C5, C4, C3, C2, C1 and each of the terminals b of the switches Sw5d, Sw4d, Sw3d, Sw2d, Sw1d are grounded alike to the ground G.

Figure 14A:
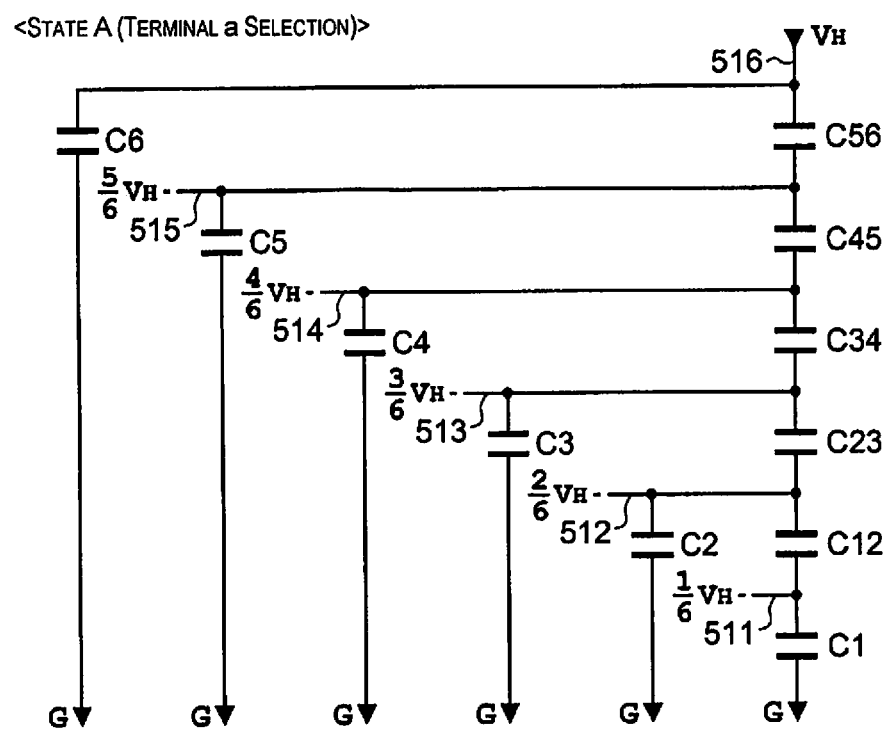
FIGS. 14A and 14B are drawings for describing the operation of an auxiliary power source circuit.
Figure 14B:
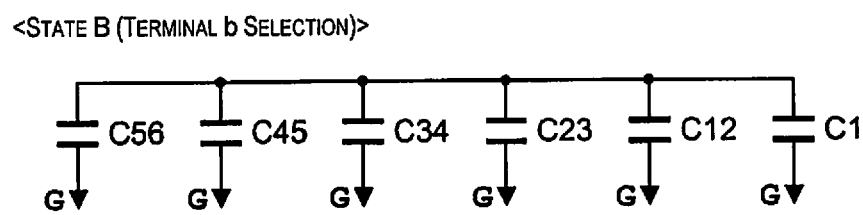

FIGS. 14A and 14B are drawings illustrating a state of connection of the switches in the auxiliary power source section 50.

Each of the switches takes one of two states, a state (state A) where the shared terminal is connected to the terminal a or a state (state B) where the shared terminal is connected to the terminal b, depending on the control signals A/B. FIGS. 14A and 14B provide a simplified illustration, with equivalent circuitry, of the connections in the state A and the connections in the state B, respectively, in the auxiliary power source section 50.

In the state A, the capacitive elements C56, C45, C34, C23, C12, C1 are connected in series, from the voltage $V_H$ until the ground G. In the state B, the one ends of the capacitive elements C56, C45, C34, C23, C12, C1 are connected to one another, and therefore the capacitive elements are connected in parallel, and the holding voltage is equalized.

As such, when the states A, B are alternately repeated, then the voltage $V_H/6$, which was equalized during the state B, is increased by a factor of one to five by the series connection of the state A and respectively held in the capacitive elements C1 to C5; the holding voltage of this time is supplied to the drivers 30 via the power source wirings 511 to 515.

Herein, when the piezoelectric elements 40 are charged by the drivers 30, a decrease in the holding voltages does appear among the capacitive elements C1 to C5. The capacitive elements for which the holding voltage has dropped are resupplied with charge from the power source by the series connection of the state A, along with equalization with redistribution by the parallel connection of the state B, and therefore a balance is struck so as to stay at the voltages $V_H/6$, $2V_H/6$, $3V_H/6$, $4V_H/6$, $5V_H/6$ when viewed in terms of the auxiliary power source section 50 overall.

In turn, when the piezoelectric elements 40 are discharged by the drivers 30, a rise in the holding voltage does appear among the capacitive elements C1 to C5, but the charge is sent out by the series connection of the state A, along with equalization with redistribution by the parallel connection of the state B, and therefore a balance is struck so as to stay at the voltages $V_H/6$, $2V_H/6$, $3V_H/6$, $4V_H/6$, $5V_H/6$ when viewed in terms of the auxiliary power source section 50 overall. When the charge that is sent out cannot be absorbed by the capacitive elements C56, C45, C34, C23, C12, C1 and remains in excess, the excess charge is absorbed by the capacitive element C6, i.e., is regenerated to the power supply system. For this reason, when there is any other load beyond the piezoelectric elements 40, the charge is used to drive this load. When there is no other load, the charge is absorbed by the other capacitive elements, including the capacitive element C6, and therefore the power source voltage $V_H$ rises, i.e., rippling occurs, but increasing the capacitance of the coupling capacitors, including the capacitive element C6, makes it possible to avoid this in practical usage. As shall be understood from the above description, the auxiliary power source section 50 (capacitive elements C1, C2, C3, C4, C5) functions as an element (charge supply source) for supplying a charge to each of the drivers 30 (each of the piezoelectric elements 40).

With the auxiliary power source section 50, when the piezoelectric elements 40 are being discharged by the drivers 30, the holding voltage of any of the capacitive elements C1 to C6 corresponding to the power source wiring being used for this discharging may temporarily rise, but repeating between the states A and B strikes a balance so as to hold a multiplication voltage of a factor of one to six of the voltage $V_H/6$. Similarly, when the piezoelectric elements 40 are being charged by the drivers 30, the holding voltage of any of the capacitive elements C1 to C6 corresponding to the power source wiring being used for this charging may temporarily lower, but repeating between the states A and B strikes a balance so as to hold a multiplication voltage of a factor of one to six of the voltage $V_H/6$.

As will be understood by viewing the voltage waveform of the control signals COM in FIG. 4, the voltage rise for drawing in the ink and the voltage drop for discharging the ink are a set, and this set is repeated in the print operation. For this reason, with the auxiliary power source section 50, the charge that is recovered by the discharging of the piezoelectric element 40 is used in charging in the next and subsequent rounds.

As such, in the first embodiment, when the print apparatus 100A is viewed as a whole, the recovery and reuse of the charge discharged from the piezoelectric elements 40 and the stepwise charging and discharging in the drivers 30 make it possible to keep power consumption low.

In the auxiliary power source section 50, when the shared terminals of each of the switches are switched from connection to one of the terminals a, b to the other, should there be a property variance in a plurality of (in FIG. 13, ten) switches, then in some instances there could be a state where the switching is not done in unison, resulting in a short-circuiting of both ends of the capacitor elements. For example, when the terminals a are connected to the shared terminal at the switches Sw1u, Sw1d, Sw2d during switching, should there occur a state where the terminal b is connected to the shared terminal at the switch Sw2u, then both ends of the series connection between the capacitive elements C12, C23 would end up short-circuiting.

For this reason, the configuration is preferably such that during switching of the switches, the occurrence of such short-circuiting is minimized through a neutral state in which there is temporarily no connection to the terminals a, b.

Second Embodiment

Figure 15:
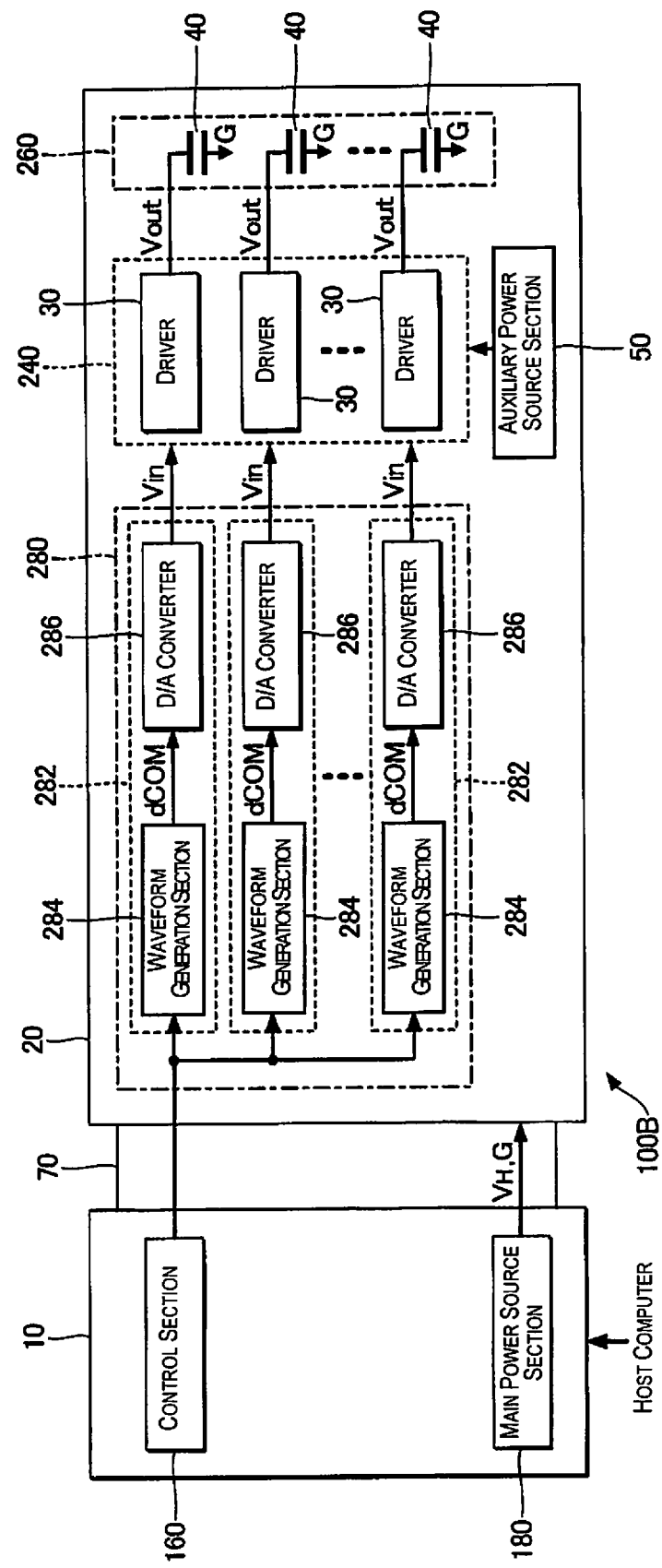
FIG. 15 is a drawing illustrating the schematic configuration of a print apparatus in a second embodiment.

FIG. 15 is a block diagram of a print apparatus 100B as in a second embodiment. As illustrated in FIG. 15, the print apparatus 100B of the second embodiment is a configuration in which the print data generation section 120 and control signal supply section 140 in the control unit 10 of the print apparatus 100A of the first embodiment are replaced with a control section 160, and the head control section 220 and the selection section 230 of the print head 20 are replaced with a signal generation section 280. In each of the embodiments illustratively exemplified below, the reference numerals to which reference has been made in the description of the first embodiment shall be reappropriated for those elements for which the actions and functions are similar to those of the first embodiment, and more detailed respective descriptions thereof are omitted as appropriate.

The signal generation section 280 of FIG. 15 is an element for supplying the control signal Vin to each of the drivers 30 of the element drive section 240, and is equipped with a plurality (the same number as the number of the piezoelectric elements 40) of control signal generation sections 282 corresponding to the different piezoelectric elements 40. That is to say, the control signal supply sections 282 are in a one-to-one correspondence with the sets of the drivers 30 and the piezoelectric elements 40. Each of the control signal supply sections 282 of the second embodiment is an element for generating the control signal Vin and supplying same to the driver 30 of the subsequent stage, and is configured so as to comprise a waveform generation section 284 and a D/A converter 286. The waveform generation section 284 generates the digital control signal dCOM, similarly with respect to the waveform generation section 144 of the first embodiment. The D/A converter 286 converts the control signal dCOM generated by the waveform generation section 284 into the analog control signal Vin, and supplies same to the driver 30, similarly with respect to the D/A converter 145 of the first embodiment. That is to say, in the first embodiment, the control signal COM shared across the plurality of piezoelectric elements 40 is distributed to each of the plurality of drivers 30 by the selection section 230, whereas in the second embodiment, the control signal Vin is generated mutually independently for every piezoelectric element 40 by each of the control signal supply sections 282 and then supplied to each of the drivers 30.

The control section 160 of the control unit 10 designates the control signal Vin that should be generated by each of the control signal supply sections 282, sequentially for each of the plurality of control signal supply sections 282, in accordance with the image data (print data DP). More specifically, the control section 160 designates the control signal Vin for each of the control signal supply sections 282 in every print cycle Ta, so that ink droplets of the amount of discharge corresponding to the image data is discharged by each of the piezoelectric elements 40 from the nozzles. Because the control signal Vin is individually generated by each of the control signal supply sections 282 in accordance with the designation coming from the control section 160, the control signals Vin generated by each of the control signal supply sections 282 can have different waveforms or positions (phases) on the time axis. That is to say, the amount of ink droplets discharged by the piezoelectric elements 40 (the diameter of the dots formed on the recording medium with the ink droplets) or the discharge timing (the landing positions of the ink droplets on the recording medium) are adjusted individually for every piezoelectric element 40.

In the second embodiment, as well, the drivers 30 installed for every piezoelectric element 40 generate the voltage Vout from the control signal Vin and supply same to the piezoelectric elements 40, and therefore, similarly with respect to the first embodiment, an advantage arises in that the withstand voltage performance and withstand current performance required for each of the wirings and each of the circuits can be reduced in comparison to the comparative example. Additionally, in the second embodiment, each of the control signal supply sections 282 generates the control signal Vin individually for every piezoelectric element 40. As such, an advantage arises in that the waveform or position of the control signal Vin can be adjusted for every piezoelectric element 40 in accordance with, for example, the properties of each of the discharge sections 400 (for example, the conversion efficiency of the piezoelectric elements 40) makes it possible to reduce the impact of differences in the properties of each of the piezoelectric elements 40.

Application/Modification Examples

The present invention is not limited by the embodiment described above, but rather, a variety of applications and modifications, such as shall be described below by way of example, are possible. One or a plurality of arbitrarily selected embodiments of application or modification described below can also be combined as appropriate.

Negative Feedback Control

Figure 16:
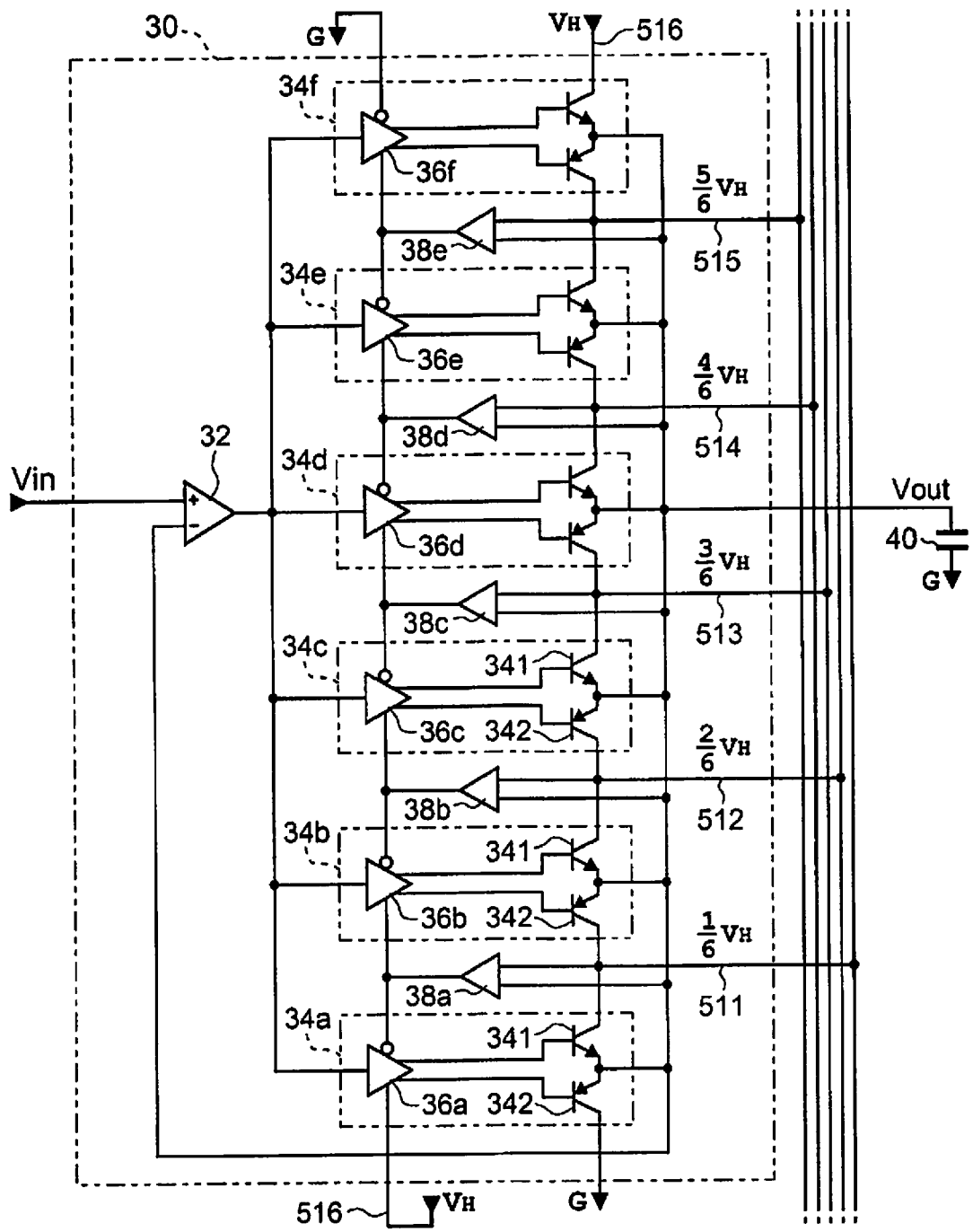
FIG. 16 is a drawing illustrating one example of the configuration of a (first) example of application of a driver.

FIG. 16 is a drawing illustrating one example of the configuration of the driver 30 as in a (first) example of application of the embodiment. As illustrated in FIG. 16, this example of application takes a configuration in which the voltage Vout of one end of the piezoelectric element 40 is negatively fed back to the input end (−) of the operational amplifier 32. With this configuration, when a difference exists between the voltage of the control signal Vout and the voltage Vout, then the transistors 341, 342 are controlled in a direction that eliminates this difference. For this reason, even in a case where the response properties of the level shifters 36a to 36f or the transistors 341, 342 are poor, the voltage Vout can be made to relatively quickly and very precisely track the control signal Vin.

Regarding the amount of negative feedback, the configuration preferably allows for property setting in accordance with the properties of the level shifters 36a to 36f and the transistors 341, 342. For example, in the depicted example, the operational amplifier 32 is configured to output a voltage obtained by subtracting the voltage Vout from the voltage of the control signal Vin, but the configuration may be such that this subtracted voltage is multiplied by an appropriate factor and then supplied to the level shifters 36a to 36f.

Figure 17:
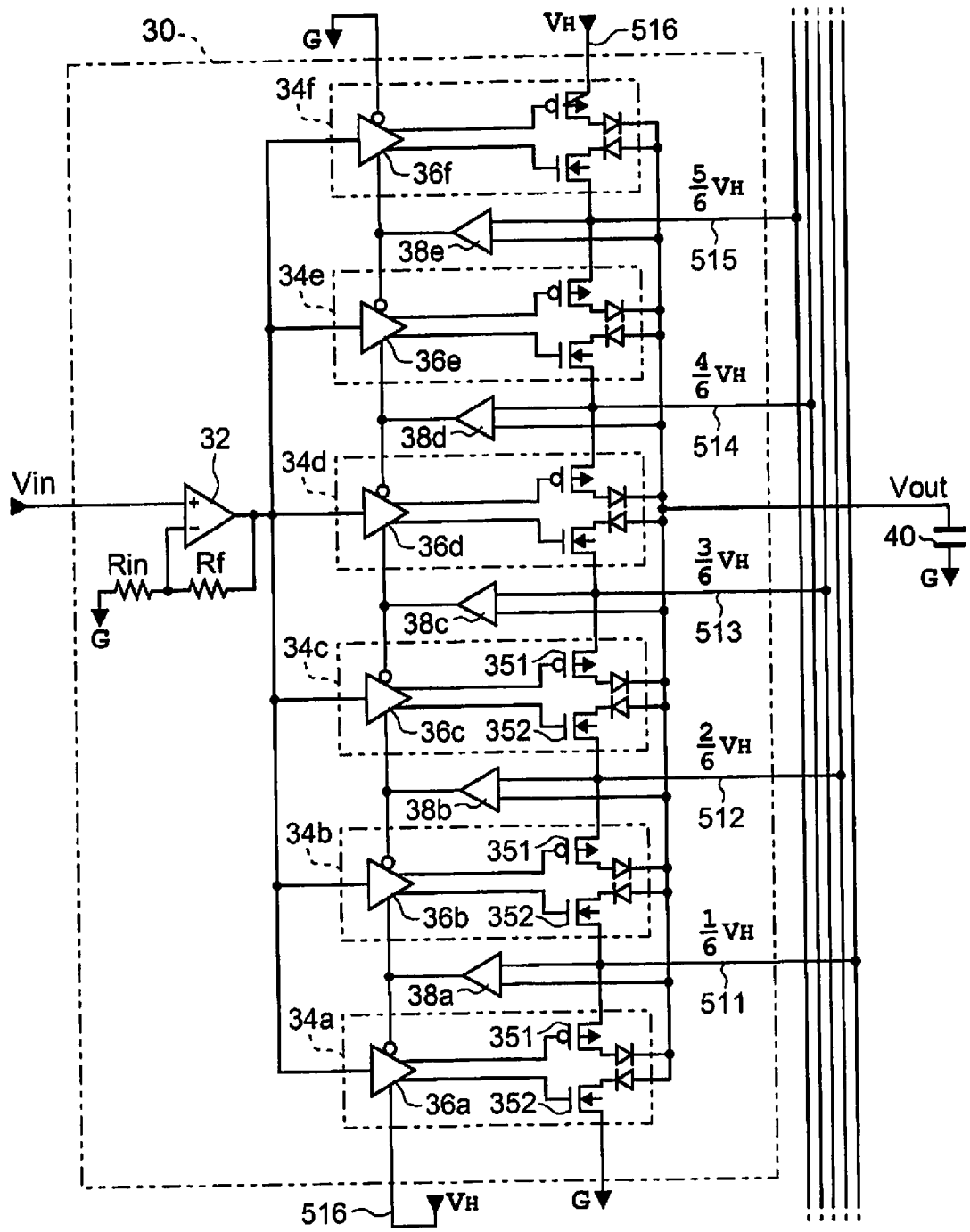
FIG. 17 is a drawing illustrating one example of the configuration of a (second) example of application of a driver.

FIG. 17 is a drawing illustrating one example of a configuration of the driver 30 as in another (second) example of application of the embodiment. In the driver 30 described in FIG. 5, the transistors 341, 342 of the unit circuits 34a to 34f were of a bipolar type, but in the (second) example of application illustrated in FIG. 17, the transistors 341, 342 are made to be Metal-Oxide-Semiconductor Field-Effect Transistors (MOSFETs) 351, 352 of a P- or N-channel type, respectively.

In the case where the MOSFETs 351, 352 are used, it suffices to provide diodes for preventing reverse current between each of the drain terminals and the one end of the piezoelectric element 40. Also, regarding the level shifters 36a to 36f in the case where the MOSFETs 351, 352 are used, the configuration is such that when the enable state is in effect, the voltage of the control signal Vin is shifted by an amount equivalent to a threshold voltage, as the predetermined value, in the minus direction and then the shifted voltage is supplied to a gate terminal of the MOSFET 351 of the P-channel type, and in turn the voltage of the control signal Vin is shifted by an amount equivalent to a threshold voltage, as the predetermined value, in the plus direction and then the shifted voltage is supplied to a gate terminal of the MOSFET 352 of the N-channel type.

A configuration, such as is illustrated in FIG. 16, in which the voltage Vout is negatively fed back may also be applied in the case where the MOSFETs 351, 352 are used.

Driven Objects

The foregoing embodiments describe the piezoelectric elements 40 by way of example as the driven objects of the drivers 30. The present invention is not limited to the piezoelectric elements 40 as the driven objects, and may be applied to any and all loads that have a capacitive component, such as, for example, an ultrasonic motor, a touch panel, a flat speaker, or a liquid crystal or other kind of display.

Number of Stages of Unit Circuits

The embodiment had a configuration in which six stages of unit circuits 34a to 34f are provided in ascending order of voltage, so as to correspond to two mutually adjacent voltages out of the seven types of voltages, but in the present invention, the number of stages of unit circuits is not limited thereto, and need only be two stages or more. The voltages, too, need not necessarily be evenly spaced.

Comparators

The embodiment had a configuration in which, for example, the first state is detected as being in effect when the determination result of the comparator 38a is false (when the output signal is the L level) and the second state is detected as being in effect when the determination result of the comparator 38a is true (the output level is the H level) and the determination result of the comparator 38b is false. That is to say, the configuration for detecting the first state and second state is a configuration of partial overlap, not separation from one another, and a configuration in which the first state to sixth state are detected with the entirety of the comparators 38a to 38e. There is no limitation thereto, and the configuration may also be one where each of the states is detected individually.

Level Shifters in Disable State

The embodiment has a configuration in which the level shifters 36a to 36f, which in the disable state, supply voltage zero to the base (gate) terminals of the transistors 341 (351) and supply the voltage $V_H$ to the base (gate) terminals of the transistors 342 (352), but there is no limitation thereto, provided that the transistors 341, 342 can be turned off. For example, the configuration may be one where the level shifters 36a to 36f, when in the disable state, supply an off signal, obtained by shifting the voltage of the control signal Vin in the plus direction, to the base (gate) terminals of the transistors 341 (351) and supply an off signal, obtained by shifting the voltage of the control signal Vin in the minus direction, to the base (gate) terminals of the transistors 342 (351).

According to this configuration, the breakdown voltage of the transistors 341 (351), 342 (352) is lower, and therefore it is possible to reduce the transistor size of when transistors are being formed on the semiconductor substrate.

General Interpretation of Terms

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. A liquid discharge apparatus comprising:
   a first discharge section and a second discharge section each having a nozzle configured and arranged to discharge a liquid, a pressure chamber in communication with the nozzle, and a piezoelectric element provided for the pressure chamber and configured and arranged to cause the liquid to be discharged from the nozzle by charging and discharging in accordance with a drive signal;
   a first connection path selection section configured to selectively supply a plurality of voltages to the first discharge section, the first connection path selection section being arranged so as to correspond to the first discharge section;

a second connection path selection section configured to selectively supply a plurality of voltages to the second discharge section, the second connection path selection section being arranged so as to correspond to the second discharge section; and a voltage generation section configured to generate and supply the voltages shared by the first connection path selection section and the second connection path selection section.

2. The liquid discharge apparatus of claim 1, further comprising a control signal supply section configured to supply a control signal, a first switch configured and arranged to control supply/shutting off of the control signal to the first connection path selection section, and a second switch configured and arranged to control supply/shutting off of the control signal to the second connection path selection section, wherein the first connection path selection section is configured to selectively supply the voltages to the first discharge section in accordance with the control signal supplied from the first switch, and the second connection path selection section is configured to selectively supply the voltages to the second discharge section in accordance with the control signal supplied from the second switch.

3. The liquid discharge apparatus of claim 2, wherein each of the first connection path selection section and the second connection path selection section is configured and arranged to control a charge with which the piezoelectric element is charged or a charge discharged from the piezoelectric element, at a voltage obtained when a voltage found by subtracting a voltage held by the piezoelectric element from the voltage of the control signal is multiplied by a predetermined number.

4. The liquid discharge apparatus of claim 1, further comprising a first control signal supply section configured to generate a control signal and selectively supply the control signal to the first connection path selection section, the first control signal supply section being arranged so as to correspond to the first connection path selection section, and a second control signal supply section configured to generate a control signal and selectively supply the control signal to the second connection path selection section, the second control signal supply section being arranged so as to correspond to the second connection path selection section, wherein the first connection path selection section is configured to selectively supply the voltages to the first discharge section in accordance with the control signal supplied from the first control signal supply section, and the second connection path selection section is configured to selectively supply the voltages to the second discharge section in accordance with the control signal supplied from the second control signal supply section.

5. The liquid discharge apparatus of claim 1, further comprising a first signal path through which a first voltage is applied by the voltage generation section, and a second signal path through which a second voltage higher than the first voltage is applied by the voltage generation section, wherein the first connection path selection section electrically connects the first discharge section and the voltage generation section by the first signal path or the second signal path in accordance with a voltage of a control signal and a holding voltage of the piezoelectric element, and the second connection path selection section electrically connects the second discharge section and the voltage generation section by the first signal path or the second signal path in accordance with the voltage of the control signal and the holding voltage of the piezoelectric element.

6. The liquid discharge apparatus of claim 5, further comprising a detection section configured and arranged to detect whether or not the holding voltage of the piezoelectric element is less than the first voltage, or whether or not the holding voltage of the piezoelectric is between the first voltage and less than the second voltage.

7. The liquid discharge apparatus of claim 5, wherein each of the first connection path selection section and the second connection path selection section is configured and arranged to control a charge with which the piezoelectric element is charged via the first signal path in conformity with the voltage of the control signal at less than the first voltage, and to control a charge discharged from the piezoelectric element via the first signal path or a charge with which the piezoelectric element is charged via the second signal path in accordance with the voltage of the control signal at between the first voltage and less than the second voltage.

8. The liquid discharge apparatus of claim 5, wherein each of the first connection path selection section and the second connection path selection section includes a first transistor, a second transistor, and a third transistor, wherein at less than the first voltage, the first transistor controls a charge with which the piezoelectric element is charged via the first signal path in accordance with a voltage obtained when the voltage of the control signal is shifted by a predetermined value to a low side, and at between the first voltage and less than the second voltage, the second transistor controls a charge discharged from the piezoelectric element via the first signal path in accordance with a voltage obtained when the voltage of the control signal is shifted by the predetermined value to a high side, and the third transistor controls a charge with which the piezoelectric element is charged via the second signal path in accordance with a voltage obtained when the voltage of the control signal is shifted by the predetermined value to the low side.

9. The liquid discharge apparatus of claim 8, wherein the first transistor is off at not less than the first voltage, and the second transistor and the third transistor are off at not between the first voltage and less than the second voltage.

* * * * *